(12) United States Patent
Sugioka

(10) Patent No.: US 10,832,924 B2
(45) Date of Patent: Nov. 10, 2020

(54) SUBSTRATE TREATING DEVICE AND SUBSTRATE TREATING METHOD

(71) Applicant: SCREEN Holdings Co., Ltd., Kyoto (JP)

(72) Inventor: Shinji Sugioka, Kyoto (JP)

(73) Assignee: SCREEN Holdings Co., Ltd. (JP)

(*) Notice: Subject to any disclaimer, the term of this patent is extended or adjusted under 35 U.S.C. 154(b) by 32 days.

(21) Appl. No.: 15/710,061

(22) Filed: Sep. 20, 2017

(65) Prior Publication Data

US 2018/0090346 A1    Mar. 29, 2018

(30) Foreign Application Priority Data

Sep. 23, 2016  (JP) .................. 2016-185859
Aug. 17, 2017  (JP) .................. 2017-157569

(51) Int. Cl.

| H01L 21/67 | (2006.01) |
|---|---|
| C09K 13/00 | (2006.01) |
| C09K 13/04 | (2006.01) |
| H01L 21/306 | (2006.01) |
| H01L 21/66 | (2006.01) |
| H01L 21/3213 | (2006.01) |

(52) U.S. Cl.
CPC ........ *H01L 21/67086* (2013.01); *C09K 13/00* (2013.01); *C09K 13/04* (2013.01); *H01L 21/30604* (2013.01); *H01L 21/67253* (2013.01); *H01L 22/26* (2013.01); *H01L 21/32134* (2013.01)

(58) Field of Classification Search
CPC ........................ C09K 13/00; C09K 13/04
See application file for complete search history.

(56) References Cited

U.S. PATENT DOCUMENTS

| 5,855,792 A * | 1/1999 | Adams ............... C02F 9/00 |
|---|---|---|
| | | 134/10 |
| 2002/0001967 A1 * | 1/2002 | Yokomizo ........ H01L 21/31111 |
| | | 438/745 |

(Continued)

FOREIGN PATENT DOCUMENTS

| JP | H0835079 A | 2/1996 |
|---|---|---|
| JP | 11-067707 A | 3/1999 |

(Continued)

*Primary Examiner* — Sharidan Carrillo
(74) *Attorney, Agent, or Firm* — Ostrolenk Faber LLP

(57) ABSTRACT

A substrate treating device immerses substrates in a mixed-acid aqueous solution, and performs an etching treatment on the substrates. The substrate treating device includes: a treating tank that stores the mixed-acid aqueous solution; a treating-liquid exchange unit that performs a total liquid exchange of the mixed-acid aqueous solution based on a life time of the mixed-acid aqueous solution in the treating tank; a detecting unit that detects a pure-water concentration of the mixed-acid aqueous solution; a concentration control unit that controls, based on the pure-water concentration detected by the detecting unit, the pure-water concentration such that the pure-water concentration becomes a predetermined target concentration by supplying pure water to the mixed-acid aqueous solution in the treating tank; and a target-value change unit that changes a lower-side standard value (a target concentration).

13 Claims, 15 Drawing Sheets

(56) References Cited

U.S. PATENT DOCUMENTS

| | | | |
|---|---|---|---|
| 2005/0230045 A1* | 10/2005 | Okuchi | H01L 21/31111 156/345.18 |
| 2008/0236639 A1* | 10/2008 | Kimura | H01L 21/67057 134/57 R |
| 2009/0246968 A1 | 10/2009 | Nakajima et al. | 438/745 |
| 2013/0312789 A1* | 11/2013 | Uchibe | B08B 3/12 134/1.3 |
| 2014/0206110 A1* | 7/2014 | Lee | H01L 21/30608 438/16 |
| 2018/0090340 A1* | 3/2018 | Sugioka | H01L 21/67017 |
| 2018/0090346 A1* | 3/2018 | Sugioka | C09K 13/00 |

FOREIGN PATENT DOCUMENTS

| | | |
|---|---|---|
| JP | 2015-046443 A | 3/2015 |
| KR | 10-2009-0102640 A | 9/2009 |

\* cited by examiner

SUBSTRATE TREATING DEVICE AND SUBSTRATE TREATING METHOD

CROSS-REFERENCE TO RELATED APPLICATION

This application is based upon and claims the benefit of priority of the prior Japanese Patent Applications No. 2016-185859, filed on Sep. 23, 2016 and No. 2017-157569, filed on Aug. 17, 2017, the entire contents of which are incorporated herein by reference.

BACKGROUND OF THE INVENTION

(1) Field of the Invention

The present invention relates to a substrate treating device and a substrate treating method for performing an etching treatment and a washing treatment on a substrate such as a semiconductor wafer by immersing the substrate into a treating liquid stored in a treating tank. Particularly, the present invention relates to concentration control of a treating liquid in a treating tank.

(2) Description of Related Art

A manufacturing process of a semiconductor device includes a step of performing an etching treatment and a washing treatment on a substrate such as a semiconductor wafer by immersing the substrate into the treating tank. Such a step is performed by a substrate treating device that includes a plurality of treating tanks. A concentration of the treating liquid in each treating tank of the substrate treating device changes in some cases along with a lapse of time due to evaporation and decomposition of a treating-liquid constituent component. Therefore, concentration control of the treating liquid is performed to maintain its concentration within a range suitable for the etching treatment and the washing treatment.

As such a technique, the following technique is well-known. That is, the technique employs a tank from which a treating liquid is supplied to the treating tank. When the concentration of the treating liquid existing in the tank and the circulation line is out of a predetermined range, using a concentration correction unit, a treating-liquid constituent component is injected into the circulation line, at an injection position which is set on the downstream side of the outlet of the tank, and on the upstream side of a connection region in which a liquid treating unit is connected, thus mixing the treating-liquid constituent component with the treating liquid that flows in the circulation line. With this configuration, the concentration of the treating liquid flowing in the circulation line is corrected (refer to JP2015-46443 A, for example).

According to the above conventional technique, the concentration of a treating liquid existing in the circulation line is measured by a concentration meter disposed in a circulation line. However, in some cases, a measurement value obtained with the concentration meter receives an influence of a state of the treating liquid in the circulation line. Therefore, even when an apparent concentration of the treating liquid is controlled to become a target value by feedback control, the actual concentration of the treating liquid becomes divergent from the apparent concentration, in some cases, along with a lapse of time.

When a treating liquid includes a plurality of agents and pure water, a treating-liquid constituent component includes components that can easily evaporate and components that cannot easily evaporate. Therefore, even when the concentration is controlled without considering a difference in volatility between the respective components, it has been difficult in some cases to maintain the concentration of the treating liquid within a range suitable for performing a target treatment.

SUMMARY OF THE INVENTION

The present invention has been made in consideration of the above situation. An object of the present invention is to provide, in a substrate treating device and a substrate treating method, a technique capable of maintaining the concentration of a treating liquid in a treating tank, more accurately, in the concentration which is suitable for the treatment to be performed in the treating tank.

In order to achieve the above object, the present invention provides a substrate treating device that performs a predetermined treatment on a substrate by immersing the substrate into a treating liquid including one or more kinds of chemical liquids and pure water. The substrate treating device includes: a treating tank that stores the treating liquid with which the predetermined treatment is performed on the substrate; a treating-liquid exchange unit that exchanges the treating liquid based on a life time of the treating liquid in the treating tank; a detecting unit that detects a concentration of the pure water or of other predetermined components in the treating liquid; a concentration control unit that controls, based on the concentration detected by the detecting unit, the concentration such that the concentration becomes a predetermined target concentration, by supplying the pure water or the other predetermined components to the treating liquid in the treating tank; and a target-value change unit that changes the target concentration.

With this configuration, even when the actual concentration of the pure water or of the other predetermined components is divergent from the apparent concentration of the pure water or of the other predetermined components, or when the actually obtained treatment state is divergent from the treatment state which is assumed from the detected concentration (an etching rate, for example), for example, a detection value of the detecting unit changes due to the state of the treating liquid, it is possible to control the concentration of the pure water or of the other predetermined components, more accurately, in a proper value corresponding to the treatment, by canceling the divergence by changing a target concentration. In this case, the life time of the treating liquid is usage time beyond which a continuous use of the treating liquid in a changed state is determined to lead to insufficient performance of the treatment. The life time of the treating liquid is determined in advance by experiment or the like. The "based on a life time" may refer to the lapse of the life time, and a time point slightly around the lapse time of the life time.

In the present invention, the target-value change unit may increase the target concentration in the middle of the life time of the treating liquid. With this configuration, by more supplying the pure water or the other predetermined components in the middle of the life time of the treating liquid, the divergence can be canceled and the concentration of the pure water or of the other predetermined components can be controlled in a proper value corresponding to the treatment. In this case, as compared with the control of reducing the concentration of the pure water or of the other predetermined components, the concentration of the pure water or of the other predetermined components can be more easily controlled in a proper value corresponding to the treatment.

In the present invention, the target-value change unit may have an upper limit value provided in the target concentration. With this configuration, it is possible to prevent the target concentration from excessively increasing in the middle of life time of the treating liquid.

In the present invention, the treating liquid may be a mixed-acid aqueous solution containing at least one of phosphoric acid, nitric acid, and acetic acid, and pure water. The concentration control unit may control a pure-water concentration of the mixed-acid aqueous solution such that the pure-water concentration becomes a predetermined target concentration by supplying the pure water to the mixed-acid aqueous solution. With this configuration, the concentration of pure water can be controlled in a proper value corresponding to the treatment, by a simple operation of changing a supply quantity and a supply timing of pure water.

Further, in the present invention, the target-value change unit may increase the target concentration at every fixed time in the middle of the life time of the treating liquid. With this configuration, the concentration of the pure water or of the other predetermined components can be controlled more stably in a proper value corresponding to the treatment while suppressing a rapid change in the target concentration.

Further, in the present invention, the target-value change unit may change a change profile of the target concentration by changing a timing of increasing the target concentration in the middle of the life time of the treating liquid. With this configuration, the concentration of the pure water or of the other predetermined components can be controlled in a proper value corresponding to the treatment, in accordance with a state of the treating liquid in a higher degree of freedom.

Further, in the present invention, the target-value change unit may change a change profile of the target concentration by changing an increase width of increasing the target value in the middle of the life time of the treating liquid. With this configuration too, the concentration of the pure water or of the other predetermined components can be controlled in a proper value corresponding to the treatment, in accordance with a state of the treating liquid in a higher degree of freedom.

Further, in the present invention, the target-value change unit may increase the target concentration when a treatment of the substrates has been performed in the middle of the life time of the treating liquid. When a treatment of the substrates has been performed, there is a high tendency that a metal ion is eluted from the substrate into the treating liquid. Therefore, when a treatment of the substrates has been performed, by increasing the target concentration, it is possible to control the concentration of the pure water or of the other predetermined components more accurately or at a more proper time in a proper value corresponding to the treatment.

Further, in the present invention, the target-value change unit may increase the target concentration when supply of the pure water has been performed in the middle of the life time of the treating liquid. In this case, when a treatment of the substrates has been performed, a probability that pure water is supplied is high, and a high correlation is recognized between the treatment timing of the substrate and the supply timing of pure water. Therefore, when pure water has been supplied, by also increasing the target concentration, it is possible to control the concentration of the pure water or of the other predetermined components, more accurately or at a proper time, in a proper value corresponding to the treatment.

Further, in the present invention, the target-value change unit may increase the target concentration when a treatment of a predetermined number of the substrates has been performed in the middle of the life time of the treating liquid. In this case, when a treatment of the substrates has been performed, the number of substrates to be treated is not always the same. On the other hand, what the quantity of a metal ion eluted from the substrate is directly related is the number of treated substrates rather than the number of times of treatment of the substrates. Therefore, when a treatment of the predetermined number of the substrates has been performed, by increasing the target concentration, the concentration of the pure water or of the other predetermined components can be controlled, more accurately, in a proper value corresponding to the treatment.

Further, in the present invention, the target-value change unit may increase the target concentration when a treatment quantity, which is based on both a weight coefficient indicating a degree of treatment in the treatment of the substrates and the number of the treated substrates, has become a predetermined quantity. In this case, when the treatment of the substrates has been performed, the degree of treatment for treating one substrate is different depending on a kind of the substrate. The degree of treatment may be, for example, a quantity of a treating liquid that is used for reaction in the treatment of one substrate, or may be a degree of degradation of a treating liquid due to the treatment of one substrate. Therefore, a change in the concentration of the pure water or of the other predetermined components in the treating liquid is determined by the degree of treatment in the case of treating one substrate, in addition to the number of treated substrates.

From the above, in the present invention, by increasing the target concentration, when a treatment quantity, which is based on both a weight coefficient indicating a degree of treatment in the treatment of the substrates and the number of the treated substrates, has become a predetermined quantity, it is possible to control the concentration of the pure water or of the other predetermined components more accurately in a proper value corresponding to the treatment. The treatment quantity based on both a weight coefficient and the number of the treated substrates may be calculated by multiplying the weight coefficient and the number of the treated substrates together, or may be calculated by other calculation expression such as by raising the power of the weight coefficient to the number of the treated substrates, for example.

Further, in the present invention, a plurality of kinds of substrates are treated during a life time of the treating liquid. The target-value change unit may increase the target concentration when a total treatment quantity, which is based on both a weight coefficient and the number of the treated substrates for each kind of substrate out of the plurality of kinds of substrates, has become a predetermined quantity. In this case, when the substrate treating device treats the plurality of kinds of substrates during the life time of the treating liquid, a change in the concentration of the pure water or of the other predetermined components in the treating liquid is determined by the total treatment quantity of each kind of substrate.

From the above, in the present invention, in the case of treating a plurality of kinds of substrates during the life time of the treating liquid, a target concentration is increased when a total treatment quantity, which is based on both a weight coefficient and the number of the treated substrates for each kind of substrate out of the plurality of kinds of substrates, has become a predetermined quantity. With this configuration, also in the case of treating the plurality of kinds of substrates during a life time of the treating liquid, the substrate treating device can control the concentration of the pure water or of the other predetermined components, more accurately, in a proper value corresponding to the treatment.

Further, in the present invention, the target-value change unit may increase the target concentration when a treatment of the substrates has not been performed during a predetermined waiting time during the life time of the treating liquid. In this case, when a treatment of the substrates is not performed for a long time during a life time of the treating liquid, because of the substrates not being treated for the long time, the concentration of the pure water or of the other predetermined components in the treating liquid changes in some cases due to evaporation and decomposition. Therefore, in the present invention, when the substrate treatment quantity, which is based on both the above weight coefficient and the number of the treated substrates (or a total treatment quantity of a plurality of kinds of substrates), has become a predetermined quantity, the target-value change unit increases the target concentration. Also, when a treatment of the substrates is not performed during a predetermined waiting time, the target-value change unit increases the target concentration. According to the above configuration, the treatment quantity, which is based on both a weight coefficient of the treatment of the substrates and the number of the treated substrates, can be set as a standard of concentration control of the treating liquid. At the same time, not performing the treatment of the substrates for a long time can be also set as a standard of concentration control of the treating liquid. As a result, it is possible to control the concentration of the pure water or of the other predetermined components in the treating liquid, more accurately, in a proper value corresponding to the treatment.

The present invention may be a substrate treating method for performing a predetermined treatment on a substrate by immersing the substrate into a treating liquid that includes one or more kinds of chemical liquids and pure water and is stored in a treating tank. The substrate treating method includes: a treating-liquid exchange step of exchanging the treating liquid based on a life time of the treating liquid; a concentration detecting step of detecting a concentration of pure water or of other predetermined components in the treating liquid; a concentration control step of supplying the pure water or the other predetermined components to the treating liquid in the treating tank such that the concentration becomes a predetermined target concentration, based on the concentration detected in the concentration detecting step; and a target-value change step of changing the target concentration in a middle of the life time of the treating liquid.

The present invention may be the substrate treating method in which the target-value change step includes increasing the target concentration.

The present invention may be the substrate treating method in which the target-value change step includes providing an upper limit value in the target concentration.

The present invention may be the substrate treating method in which the treating liquid is a mixed-acid aqueous solution containing at least one of phosphoric acid, nitric acid, and acetic acid, and pure water, and the concentration control step includes supplying pure water to the mixed-acid aqueous solution such that a pure-water concentration of the mixed-acid aqueous solution becomes a predetermined target concentration.

Further, the present invention may be the substrate treating method in which the target-value change step includes increasing the target concentration at every fixed time.

Further, the present invention may the substrate treating method in which the target-value change step includes changing a change profile of the target concentration by changing a timing of increasing the target concentration.

The present invention may be the substrate treating method in which the target-value change step includes changing a change profile of the target concentration by changing an increase width of increasing the target value.

Further, the present invention may be the substrate treating method in which the target-value change step includes increasing the target concentration when a treatment of the substrate has been performed.

Further, the present invention may be the substrate treating method in which the target-value change step includes increasing the target concentration when supply of the pure water has been performed.

Further, the present invention may be the substrate treating method in which the target-value change step includes increasing the target concentration when a treatment of a predetermined number of the substrates has been performed.

Further, the present invention may be the substrate treating method in which the target-value change step includes increasing the target concentration when a treatment quantity, which is based on both a weight coefficient for indicating a degree of treatment in the treatment of the substrates and the number of the treated substrates, has become a predetermined quantity.

Further, the present invention may be the substrate treating method further including treating a plurality of kinds of substrates during the life time of the treating liquid, in which the target-value change step includes increasing the target concentration when a total treatment quantity, which is based on both the weight coefficient and the number of the treated substrates for each kind of substrate out of the plurality of kinds of substrates, has become a predetermined quantity.

Further, the present invention may be the substrate treating method in which the target-value change step includes increasing the target concentration when a treatment of the substrates is not performed during a predetermined waiting time during a life time of the treating liquid.

The means for solving the problem can be used in combination appropriately.

According to the present invention, in the substrate treating device or the substrate treating method, it is possible to maintain the concentration of a treating liquid in a treating tank, more accurately, in the concentration suitable for the treatment to be performed in the treating tank.

DETAILED DESCRIPTION OF PREFERRED EMBODIMENTS

First Embodiment

Figure 1:
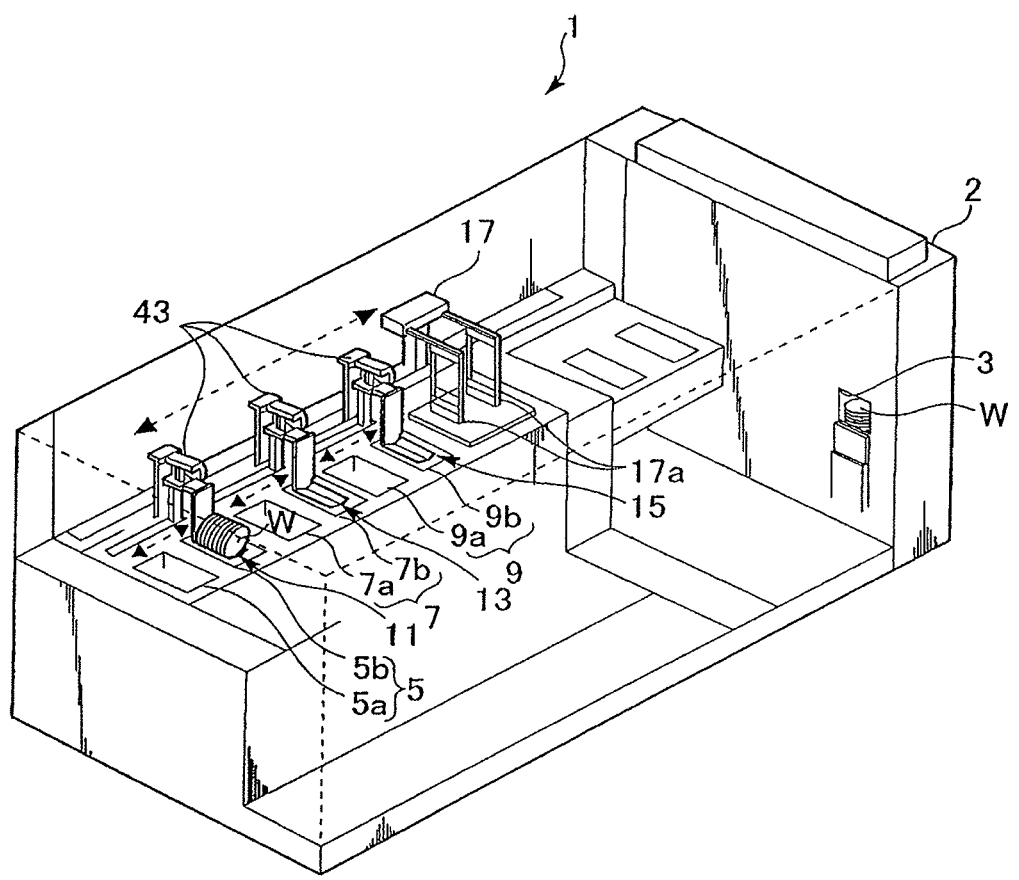
FIG. 1 is a perspective view showing a schematic configuration of a substrate treating device according to a first embodiment.

An embodiment of the present invention will be described in detail below with reference to the drawings. The embodiment described below represents one aspect of the invention of the present application, and does not limit the technical range of the invention of the present application. FIG. 1 is a perspective view showing a schematic configuration of a substrate treating device 1 according to a first embodiment. The substrate treating device 1 performs an etching treatment and a washing treatment (hereinafter, also simply referred to as a "treatment") on mainly a substrate W. In the substrate treating device 1, a buffer section 2 that stocks the substrate W is disposed on a right depth side in FIG. 1. On a further right depth side of the buffer section 2, a front panel (not shown) for operating the substrate treating device 1 is provided. Further, on an opposite side of the front panel of the buffer section 2, a substrate carry-out port 3 is provided. Further, treating units 5, 7, and 9 that perform a treatment on the substrate W are arranged side by side from an opposite side of the buffer section 2 (a left front side in FIG. 1) in a longitudinal direction of the substrate treating device 1.

The treating units 5, 7, and 9 have two treating tanks 5a and 5b, two treating tanks 7a and 7b, and two treating tanks 9a and 9b, respectively. The substrate treating device 1 also includes sub-conveying mechanisms 43 that move a plurality of substrates W, in a direction and in a range indicated by a short arrow in FIG. 1, between treating tanks 5a and 5b, between treating tanks 7a and 7b, and between treating tanks 9a and 9b respectively included in the treating units 5, 7, and 9. The sub-conveying mechanisms 43 also vertically move the plurality of substrates W in order to immerse the plurality of substrates W into the treating tanks 5a and 5b, 7a and 7b, and 9a and 9b, or lift the substrates W from the treating tanks 5a and 5b, 7a and 7b, and 9a and 9b. The sub-conveying mechanisms 43 respectively include lifters 11, 13, and 15 for holding the plurality of substrates W. Further, the substrate treating device 1 includes a main conveying mechanism 17 which is movable in a direction and in a range indicated by a long arrow in FIG. 1, in order to convey the plurality of substrates W to each of the treating units 5, 7, and 9.

The main conveying mechanism 17 has two movable arms 17a. The arms 17a have a plurality of grooves (not shown) on which the substrates W are placed. The arms 17a hold, in the state shown in FIG. 1, substrates W in a standing posture (a posture in which the normal line of a substrate main surface is laid along the horizontal direction). The two arms 17a of the main conveying mechanism 17 swing from an shape of a character "V" to an upside-down shape of a character "V" when viewed from a right diagonally lower direction in FIG. 1, thereby releasing each substrate W. With the above operation, each substrate W can be delivered between the main conveying mechanism 17 and the lifters 11, 13, and 15.

Figure 2:
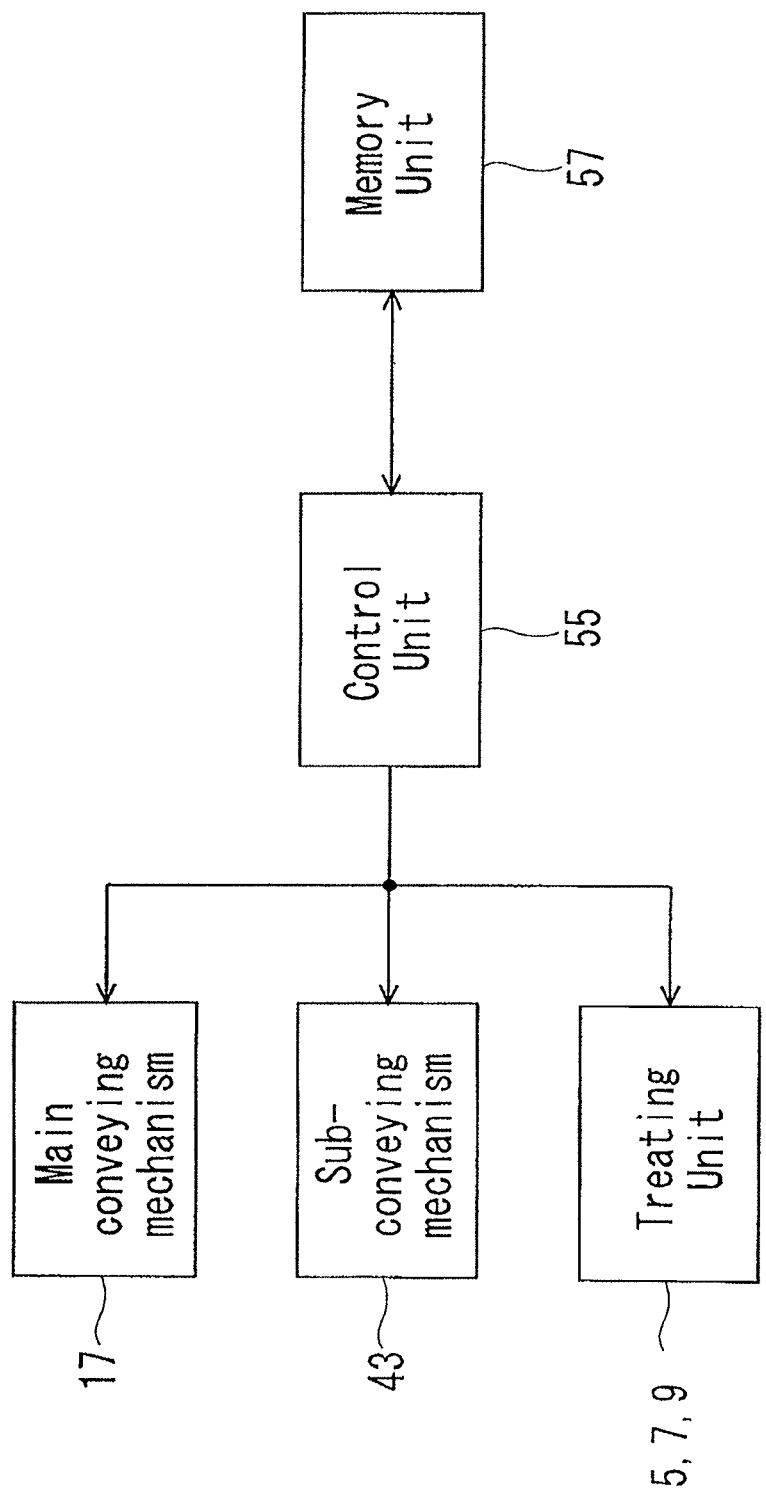
FIG. 2 is a functional block diagram of the substrate treating device according to the first embodiment.

FIG. 2 shows a functional block diagram of the substrate treating device 1. The main conveying mechanism 17, the sub-conveying mechanisms 43, and the treating units 5, 7, and 9 are integrally controlled by a control unit 55. The configuration of the control unit 55 as hardware is similar to the configuration of a general computer. That is, the control unit 55 includes, for example, a CPU that performs various arithmetic processing, a ROM which is a read-only memory that stores a basic program, a RAM which is a writable and readable memory that stores various information items, and a magnetic disc that stores control application and data. In the present embodiment, the CPU of the control unit 55 controls each unit such that each unit executes a predetermined program to convey the substrates W to the treating units 5, 7, and 9 and each unit performs a treatment in accordance with the program. The program is stored in a memory unit 57.

Figure 3:
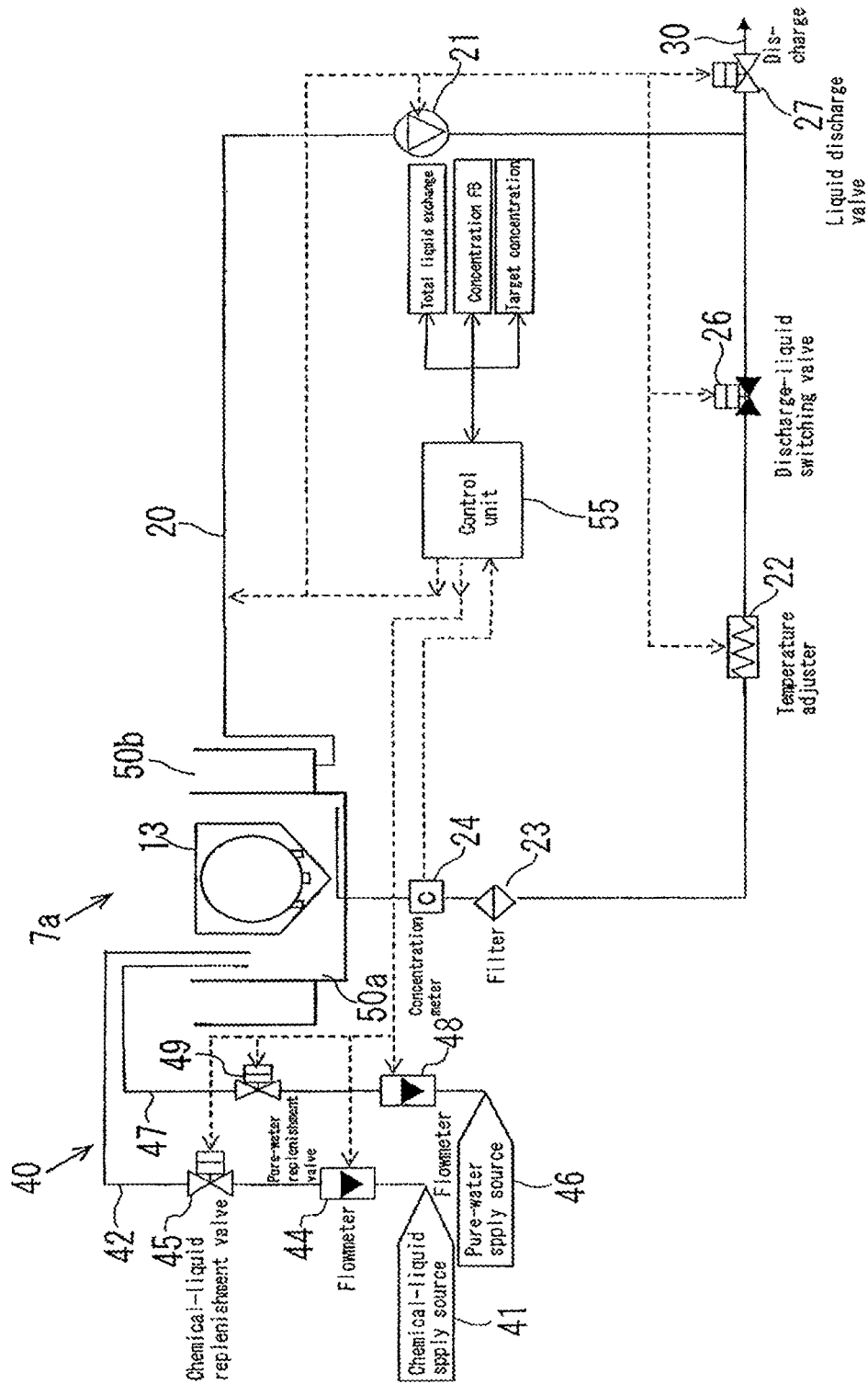
FIG. 3 is a diagram showing a configuration of treating units concerning the control of a treating liquid in each of treating tanks in the treating units of the substrate treating device according to the first embodiment.

FIG. 3 is a diagram showing a configuration concerning the control of a treating liquid in each of the treating tanks 5a, 7a, and 9a respectively included in the treating units 5, 7, and 9 of the substrate treating device 1. With reference to FIG. 3, a description will be made by taking the treating tank 7a as an example, out of the treating tanks 5a, 7a, and 9a respectively included in the treating units 5, 7, and 9. A control equivalent to or similar to the control of the treating liquid in the treating tank 7a is also applied to cases of the treating tanks 5a and 9a.

In a manufacturing process of a semiconductor wafer, a monocrystalline ingot of silicon, for example, is sliced in a rod axis direction of the ingot. The sliced wafers are sequentially subjected to chamfering, lapping, an etching treatment, a polishing treatment, and the like. As a result, a plurality of layers, structures, and circuits made of different materials are formed on the substrate surface. The etching treatment of the substrate W performed in the treating tank 7a is performed for the purpose of removing metal such as tungsten, for example, that remains on the substrate W. The etching treatment is performed by immersing, for a predetermined time, the substrate W into a mixed acid (phosphoric acid, nitric acid, acetic acid, pure water) aqueous solution as a treating liquid. The etching treatment is an example of a predetermined treatment in the present invention. The phosphoric acid, nitric acid, and acetic acid in the mixed acid are an example of "other predetermined components" in the present invention.

In FIG. 3, the treating tank 7a has a double-tank structure configured by an inner tank 50a in which the substrate W is immersed into the mixed-acid aqueous solution, and an outer tank 50b into which the mixed-acid aqueous solution, which has overflowed from the upper part of the inner tank 50a, is recovered. The inner tank 50a is a box-shaped member, in a rectangular shape in a plan view, formed of a quartz or fluororesin material which is excellent in corrosion resistance against the mixed-acid aqueous solution. The outer tank 50b is formed of a material similar to that of the inner tank 50a, and is provided to surround the outer-peripheral upper end part of the inner tank 50a.

The treating tank 7a is provided with the lifter 13 for immersing the substrate W into the mixed-acid aqueous solution stored as described above. The lifter 13 collectively holds, with three holding rods, a plurality of (for example, 50) substrates W that are arranged in parallel with each other in a standing posture. The lifter 13 is provided movably in vertical and lateral directions by the sub-conveying mechanism 43. The lifter 13 can move the plurality of substrates W up and down between a treatment position (a position in FIG. 3) at which the substrates W being held are immersed into the mixed-acid aqueous solution in the inner tank 50a and a delivery position at which the substrates W are lifted from the mixed-acid aqueous solution. The lifer 13 can also move the substrates W to the adjacent treating tank 7b.

The substrate treating device 1 includes a circulation line 20 through which the mixed-acid aqueous solution is circulated to the treating tank 7a. The circulation line 20 is a piping path for recirculating with pressure the mixed-acid aqueous solution discharged from the treating tank 7a, by heating and filtering the mixed-acid aqueous solution, into the treating tank 7a. Specifically, the circulation line 20 is configured by connecting, through the flow path, between the outer tank 50b and the inner tank 50a of the treating tank 7a. A liquid discharge line 30 is branched from the circulation line 20. To discharge the mixed-acid aqueous solution without returning the mixed-acid aqueous solution to the treating tank 7a, the discharge-liquid switching valve 26 and the liquid discharge valve 27 are opened and closed so that the mixed-acid aqueous solution discharged from the outer tank 50b is directly disposed of via the liquid discharge line 30.

In the middle of the route of the circulation line 20, in addition to valves, there are provided, from the upstream side, a circulation pump 21, a temperature adjuster 22, a filter 23, and a concentration meter 24 as a detecting unit. The circulation pump 21 draws the mixed-acid aqueous solution from the outer tank 50b via the circulation line 20, and also sends the mixed-acid aqueous solution with pressure toward the inner tank 50a. The temperature adjuster 22 heats again the mixed-acid aqueous solution flowing through the circulation line 20, to a predetermined treating temperature. A heater not shown is also provided in the treating tank 7a. The mixed-acid aqueous solution stored in the treating tank 7a is also heated so as to be maintained at a predetermined treating temperature. The filter 23 is a filter for removing foreign matters included in the mixed-acid aqueous solution flowing through the circulation line 20.

The concentration meter 24 measures a pure-water concentration out of components of the mixed-acid aqueous solution recovered to the inner tank 50a through the circulation line 20. The mixed acid concentration in the treating tank 7a is controlled such that the pure-water concentration measured by the concentration meter 24 becomes am optimum value. In this case, the treatment of measuring the pure-water concentration by the concentration meter 24 corresponds to the concentration detecting step in the present invention. The treatment of controlling the mixed acid concentration in the treating tank 7a is performed by the control unit 55. The control unit 55 in this case corresponds to the concentration control unit, and the treatment itself corresponds to the concentration control step in the present invention. More specifically, as shown in FIG. 3, the control unit 55 performs the treatment concerning the change control of the target value (a lower-side standard value) of the concentration of the mixed-acid aqueous solution, as described later, in addition to the total liquid exchange control of the mixed acid solution in the treating tank and the treatment concerning the feedback control of the concentration of the mixed-acid aqueous solution.

Next, the operation of the substrate treating device 1 having the above configuration will be described more in detail. First, regardless of whether the substrate W is immersed in the mixed-acid aqueous solution stored in the treating tank 7a, the circulation pump 21 always sends with pressure the mixed-acid aqueous solution at a fixed flow rate. The mixed-acid aqueous solution recirculated to the treating tank 7a through the circulation line 20 is supplied from the bottom part of the inner tank 50a. Accordingly, an upflow of the mixed-acid aqueous solution directed upward from the bottom part is generated inside the inner tank 50a. The mixed-acid aqueous solution supplied from the bottom part in due course overflows from the upper end part of the inner tank 50a, and flows into the outer tank 50b. The mixed-acid aqueous solution that flows into the outer tank 50b is sent from the outer tank 50b to the circulation pump 21 via the circulation line 20, and is recirculated with pressure again to the treating tank 7a. This circulation process is performed continuously.

The lifter 13 receives a plurality of substrates W at the delivery position while performing the circulation process of the mixed-acid aqueous solution through the circulation line 20. The lifter 13 then falls to a treatment position, and immerses the substrates W into the mixed-acid aqueous solution stored in the inner tank 50a. As a result, a treatment is performed for a predetermined time. After the treatment ends, the lifter 13 rises to the delivery position again and lifts the substrates W from the mixed-acid aqueous solution. Thereafter, the lifter 13 moves horizontally and falls to immerse the substrates W into the adjacent treating tank 7b, and performs a washing treatment with water.

In addition to the above provision, the substrate treating device 1 includes a concentration control device 40 for controlling the concentration of the mixed-acid aqueous solution in the treating tank 7a. The concentration control device 40 has a chemical-liquid supply source 41, a chemical liquid line 42 that connects the chemical-liquid supply source 41 to the treating tank 7a, a pure-water supply source 46, and a pure water line 47 that connects the pure-water supply source 46 to the treating tank 7a.

Although not shown in this case, in the chemical-liquid supply source 41, there are independently provided supply sources for supplying each of phosphoric acid, nitric acid, and acetic acid that form a mixed acid. In the chemical liquid line 42, there are independently provided lines for guiding each of the phosphoric acid, the nitric acid, and the acetic acid to the treating tank 7a. When a treating liquid is first generated, the treating liquid is supplied from thick piping toward the inner tank 50a, as a supply speed becomes necessary. When the treating liquid is replenished, the treating liquid is replenished toward the outer tank 50b in some cases. In each line of the chemical liquid line 42, there are provided a chemical-liquid flowmeter 44 capable of measuring a flow rate of each of the chemical liquid (phosphoric acid, nitric acid, acetic acid) that passes through the line, and a chemical-liquid replenishment valve 45 capable of adjusting a flow rate of each of the phosphoric acid, the nitric acid, and the acetic acid. On the other hand, the pure water line 47 includes a pure-water flowmeter 48 that measures a flow rate of pure water passing through the pure water line 47, and a pure-water replenishment valve 49 that adjusts the flow rate of the pure water. Further, the control unit 55 controls, based on a measurement result of the concentration meter 24, the chemical-liquid replenishment valve 45 and the pure-water replenishment valve 49 such that the concentration of the mixed-acid aqueous solution in the treating tank 7a is adjusted to the optimum concentration for the treatment.

Figure 4:
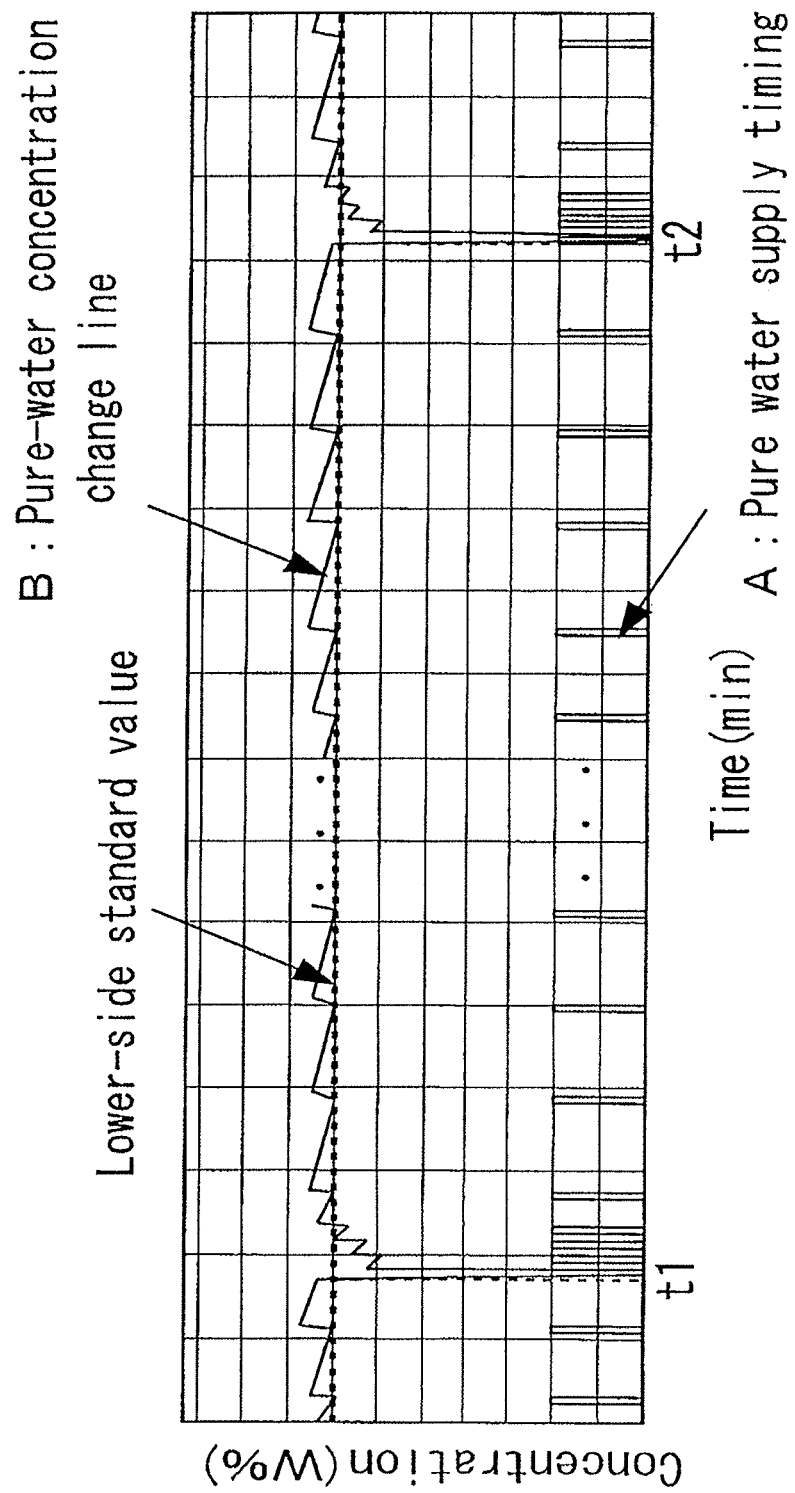
FIG. 4 is a graph showing a mode of a concentration control of a mixed-acid aqueous solution in a general treating tank.

FIG. 4 is a graph showing a mode of a conventional concentration control of the mixed-acid aqueous solution in the treating tank 7a. More specifically, FIG. 4 shows a change in the concentration (a pure-water concentration) of the mixed-acid aqueous solution in the inner tank 50a. In this case, the horizontal axis shows time, and the vertical axis shows a pure-water concentration (W %) in the mixed acid. In the graph in FIG. 4, pulse-shaped display A at a lower part shows a timing when pure water is supplied to the inner tank 50a. Further, a broken line B at an upper part shows a change in the pure-water concentration.

In FIG. 4, at a time point t1, a total liquid exchange of the mixed-acid aqueous solution is being performed. Then, at a time point t2, a total liquid exchange of the mixed-acid aqueous solution is being performed again. The interval between the time point t1 and the time point t2 may be five hours to ten hours, for example. The etching treatment of the substrates W is repeated between the time point t1 and the time point t2, and the concentration of the metal ion eluted from the substrates W increases in the mixed-acid aqueous solution. Therefore, the total of the mixed-acid aqueous solution is exchanged before the quality of the etching treatment is influenced. The period of the total liquid exchange can be considered as a life time of the mixed-acid aqueous solution in the substrate treating device 1. The total liquid exchange is performed by the control unit 55. The control unit 55 in this case corresponds to the treating-liquid exchange unit, and the control corresponds to the treating-liquid exchange step.

A horizontal broken line at an upper part of the graph in FIG. 4 show a lower-side standard value of the pure-water concentration. That is, when water in the treating tank 7a evaporates along with time and the pure-water concentration is reduced and reaches the lower-side standard value, a suitable quantity of pure water (100 ml, for example) is supplied to increase the pure-water concentration. This control is repeated. By this control, the concentration of the mixed-acid aqueous solution in the treating tank 7a is maintained at or above the lower-side standard value. Further, because the quantity of pure water supplied at one time is prescribed, the pure-water concentration does not become higher than the permissible range.

In FIG. 4, the pure-water concentration in the mixed-acid aqueous solution is once reduced to a value much lower than the lower-side standard value at the timing of the total liquid exchange of the mixed-acid aqueous solution. Thereafter, the interval of the pulse display A is shorter than in other period in a life time. As can be understood from this, the supply of pure water is repeated at short intervals, and the pure-water concentration is recovered to a value higher than the lower-side standard value during a relatively short period. This method is employed for the following reason. At the total liquid exchange time, the pure-water concentration in the mixed-acid aqueous solution easily varies. Therefore, by once setting the pure-water concentration to a state lower than the target value, the pure-water concentration is attempted to be stabilized by frequently supplying the pure water. This control is easier than performing the concentration control by supplying the mixed-acid aqueous solution.

As shown in FIG. 4, there is observed a phenomenon that when the concentration of the mixed-acid aqueous solution is maintained to be fixed, also during the life time of the mixed-acid aqueous solution, the etching rate of the substrates W is gradually reduced along with the lapse of time. This phenomenon is considered to occur for the following reason. The concentration of the metal ion eluted from the substrates W during the treatment of the substrates W becomes high. This aggravates the measurement accuracy of the concentration meter 24, and there occurs divergence between the apparent pure-water concentration and the actual pure-water concentration.

Further, the phenomenon is also considered because of the following influence. The mixed acid is formed by mixing a plurality of components, that is, phosphoric acid, nitric acid, acetic acid, and pure water. The mixed acid includes acid that cannot evaporate easily such as phosphoric acid, and acid that can evaporate easily such as nitric acid and acetic acid. Therefore, a reduction in the pure-water concentration due to the evaporation of the nitric acid and the acetic acid occurs. Accordingly, even when the apparent pure-water concentration is maintained in a suitable value, the actual pure-water concentration becomes lower.

Figure 5:
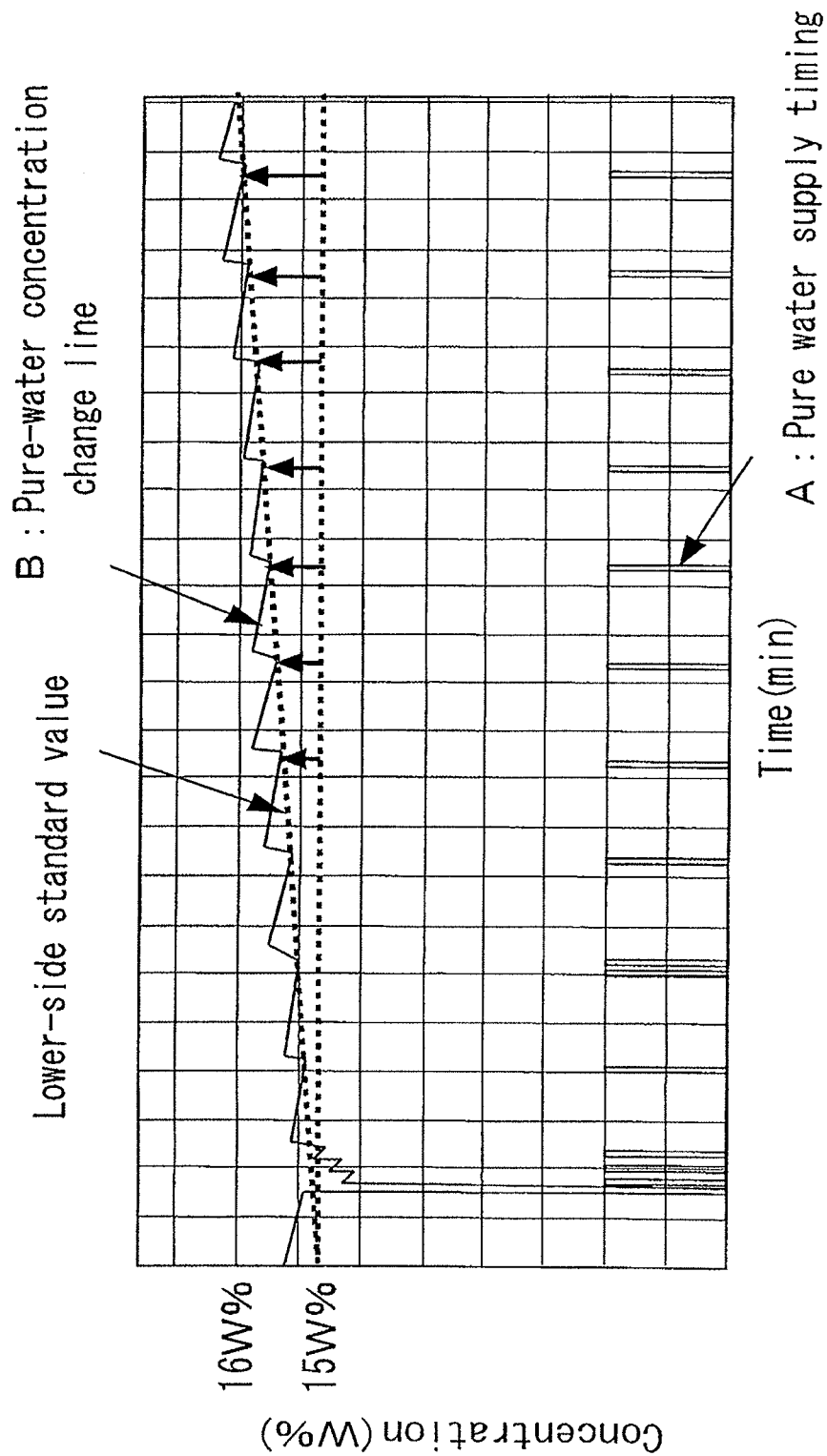
FIG. 5 is a graph showing a mode of a concentration control of a mixed-acid aqueous solution in the treating tank of the substrate treating device according to the first embodiment.

On the other hand, in the present embodiment, as shown in FIG. 5, the lower-side standard value in the concentration control of the mixed-acid aqueous solution is changed along with the lapse of time in the life time of the mixed-acid aqueous solution. With this configuration, the divergence between the apparent pure-water concentration and the true pure-water concentration is canceled, and the concentration of the mixed-acid aqueous solution in the treating tank 7a is set to be able to be maintained in a proper value. In the example in FIG. 5, the lower-side standard value of the pure-water concentration is increased from 15 (W %) to 16 (W %) for example, during a life time of the mixed-acid aqueous solution. The treatment of increasing the lower-side standard value of the pure-water concentration is performed by the control unit 55. The control unit 55 in this case configures the target-value change unit. The treatment of increasing the lower-side standard value of the pure-water concentration corresponds to the target-value change step in the present invention. Further, the lower-side standard value corresponds to the target concentration in the present invention.

In the above control, the control unit 55 as the target-value change unit may change the lower-side standard value, based on a data table. More specifically, data that changes along a predetermined change profile may be stored in advance as a table. This change profile may define a change in the lower-side standard value in a relationship with time (for example, a lapse of time from a start time t1 of the life time). The above data table may be stored in the memory unit 57, or may be stored in an external memory. The data table corresponding to the change profile may be input by an operator. Alternatively, data tables corresponding to a plurality of change profiles may be prepared in advance, and the operator may appropriately select the data table. The operator may perform the input or selection from the front panel of the substrate treating device 1 or by communication from an external computer or a mobile terminal.

The control unit 55 as a target-value change unit may change the lower-side standard value at the timing at which a predetermined condition is satisfied. The above condition may be, for example, a timing at which the treatment of the substrates W is performed, or a timing at which pure water is supplied to the treating tank 7a, or a timing at which the number of the treated substrates W has reached a predetermined number. Further, the above condition may be a timing at which a change in the lower-side standard value is permitted by the operator. In this case, when the operator manually provides a permission instruction in response to notification of a change of the lower-side standard value from the device, the lower-side standard value is changed.

Figure 6:
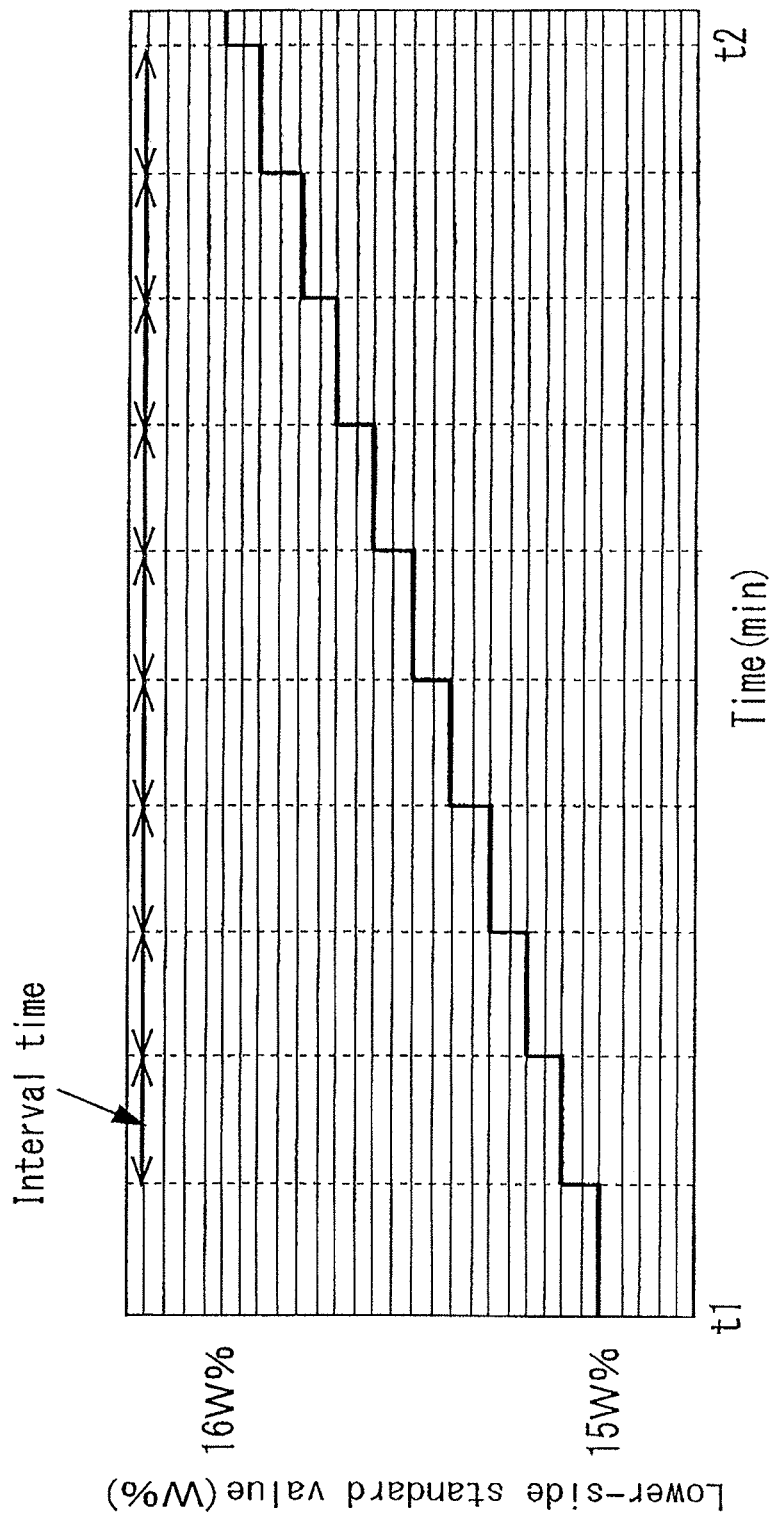
FIG. 6 shows an example of a graph of a change mode of a lower-side standard value in a life time of the mixed-acid aqueous solution according to the first embodiment.

FIG. 6 shows an example of a change mode of the lower-side standard value when the lower-side standard value of the pure-water concentration is increased at a fixed rate (from 15% to 16%, for example) during a period from the time point t1 to the time point t2 as a life time of the mixed-acid aqueous solution. In the example in FIG. 6, the life time of the mixed-acid aqueous solution is divided into n stages at an equal interval. The lower-side standard value is increased by each fixed quantity in a fixed interval at n times. With the above configuration, the target value of the concentration control of the mixed-acid aqueous solution can be linearly increased. Also, the concentration of the mixed-acid aqueous solution can be stably optimized. In FIG. 6, the line showing a change in the lower-side standard value corresponds to a change profile in the present invention. The same also applies to the line of a change in the lower-side standard value in each drawing described below.

Figure 7A:
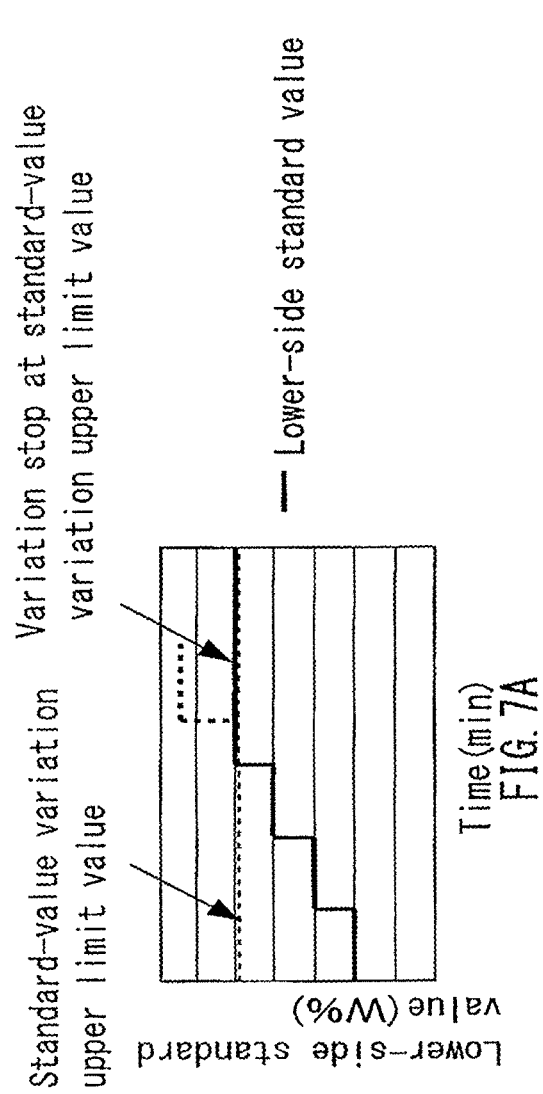
FIG. 7A and FIG. 7B show a second example of a graph of the change mode of the lower-side standard value in the life time of a mixed-acid aqueous solution according to the first embodiment.
Figure 7B:
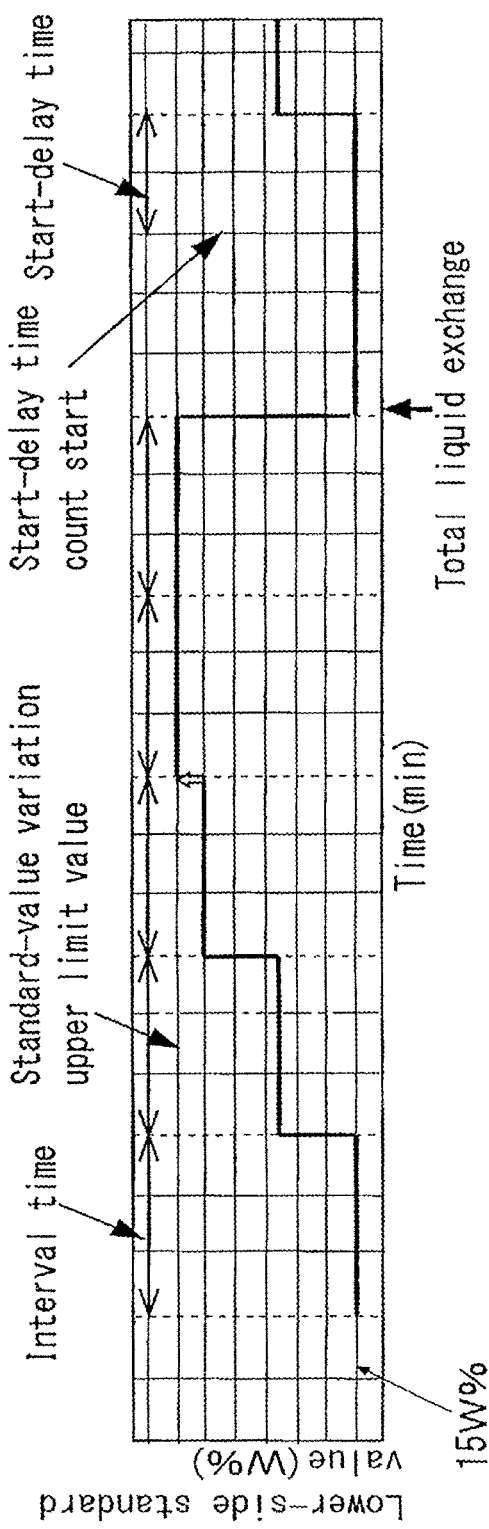

In the present embodiment, as shown in FIGS. 7A and 7B, an upper limit value may be determined in the lower-side standard value. In FIGS. 7A and 7B, after the lower-side standard value reaches a standard-value variation upper limit value (W %), the increase in the lower-side standard value is stopped. According to this configuration, regardless of how the life time of the mixed-acid aqueous solution and the increase interval of the lower-side standard value are determined, the target value of the pure-water concentration can be prevented from becoming excessively high. In the present embodiment, as shown in FIG. 7B, a predetermined start-delay time may be provided after a total liquid exchange of the mixed-acid aqueous solution. That is, it is not necessary to start increasing the lower-side standard value immediately after the total liquid exchange of the mixed-acid aqueous solution. The increase in the lower-side standard value may be started when the concentration of the metal ion eluted from the substrates W becomes high, or when the evaporation quantity of nitric acid or acetic acid becomes large. According to the above configuration, the lower-side standard value can be changed at a higher degree of freedom.

Figure 8:
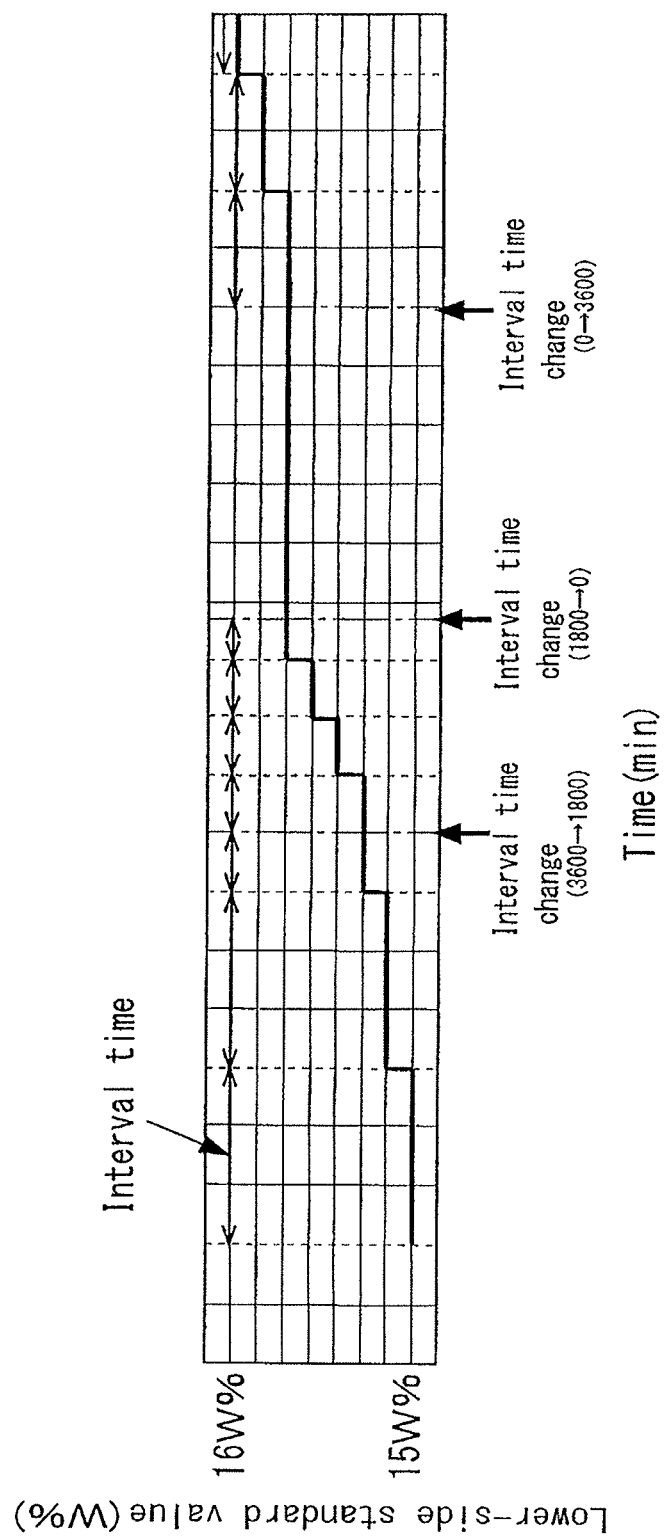
FIG. 8 shows a third example of a graph of the change mode of the lower-side standard value in the life time of a mixed-acid aqueous solution according to the first embodiment.

In the present embodiment, during a life time of the mixed-acid aqueous solution, the lower-side standard value of the concentration control is not always necessary to be increased at an equal interval. FIG. 8 shows an example of a change mode of the lower-side standard value when the lower-side standard value of the pure-water concentration is increased from 15 (W %) to 16 (W %), for example, during a period of 720 minutes as an example of a life time of the mixed-acid aqueous solution. In the example in FIG. 8, after the initial-variation start delay time of 60 minutes (3600 seconds) elapses, the interval time for changing the lower-side standard value of the concentration control is changed from 90 minutes (5400 seconds) to 60 minutes (3600 seconds), and then to 30 minutes (1800 seconds). Thereafter, the change in the lower-side standard value of the concentration control is temporarily stopped (interval time of 30 minutes (1800 seconds) to 0 minutes (0 seconds). Further, the interval time is changed from 0 minutes (0 seconds) to 60 minutes (3600 seconds).

In this way, in the life time of the mixed-acid aqueous solution, the interval time can be changed freely. In the life time of the mixed-acid aqueous solution, when the concentration of the metal ion accumulated in the mixed-acid aqueous solution has become higher than a fixed value and an influence to the measurement accuracy of the concentration meter appears remarkably, the interval time may be changed to become gradually shorter in the 720 minutes as an example of a life time of the mixed-acid aqueous solution.

Second Embodiment

Next, a second embodiment of the present invention will be described. In the first embodiment, the increase in the lower-side standard value of the concentration control of the mixed-acid aqueous solution is controlled based on a change time by having a change quantity fixed. The second embodiment of the present invention is different in that the lower-side standard value of the concentration control of the mixed-acid aqueous solution is controlled by changing a change width of the lower-side standard value.

Figure 9:
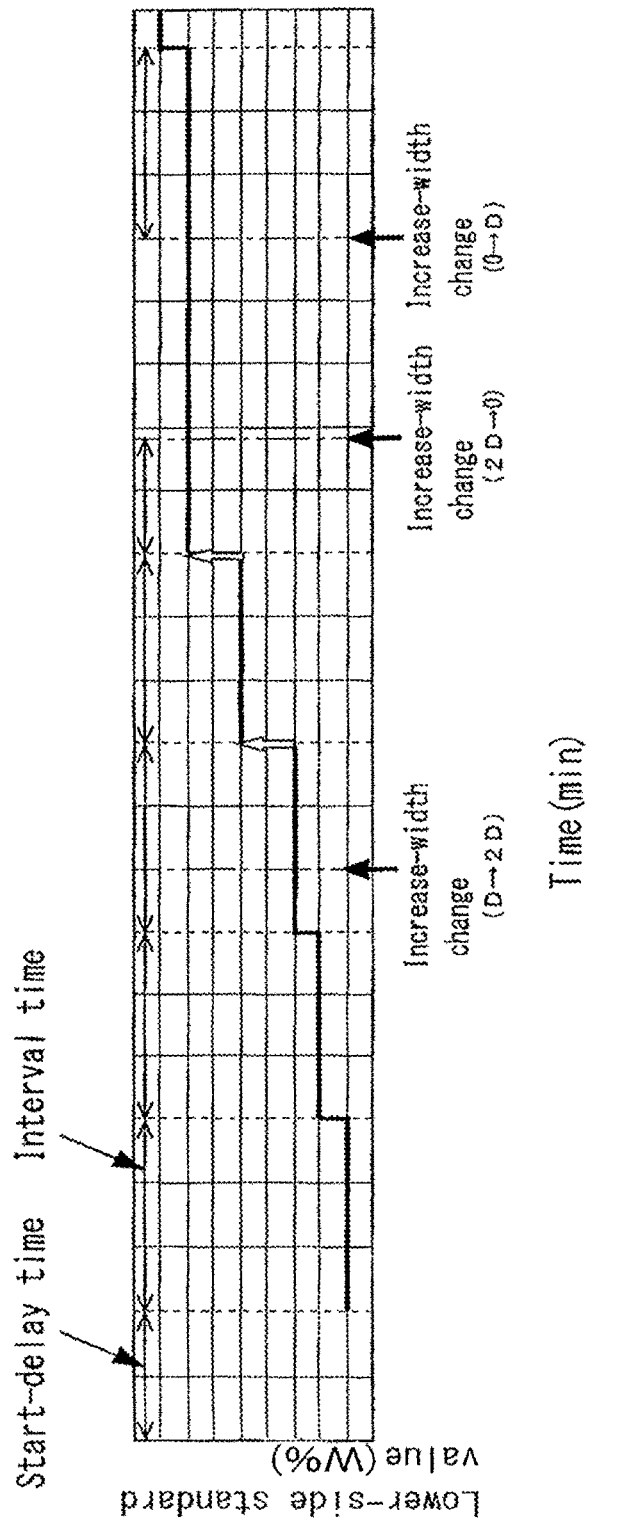
FIG. 9 shows an example of a graph of a change mode of a lower-side standard value in a life time of a mixed-acid aqueous solution according to a second embodiment.

In FIG. 9, after the initial-variation start delay time of 60 minutes (3600 seconds) elapses, the interval time for changing the lower-side standard value of the concentration control is set at 90 minutes (5400 seconds). Concerning the first two intervals, the increase width (offset) of D (W %) is set for each interval. At the third and fourth intervals elapse, the increase width (offset) of 2*D (W %) is set. Thereafter, a change in the lower-side standard value of the concentration control is temporarily stopped (the increase width (offset)=0) is set. Further, the increase width is changed to the increase width (offset) of D (W %).

Figure 10:
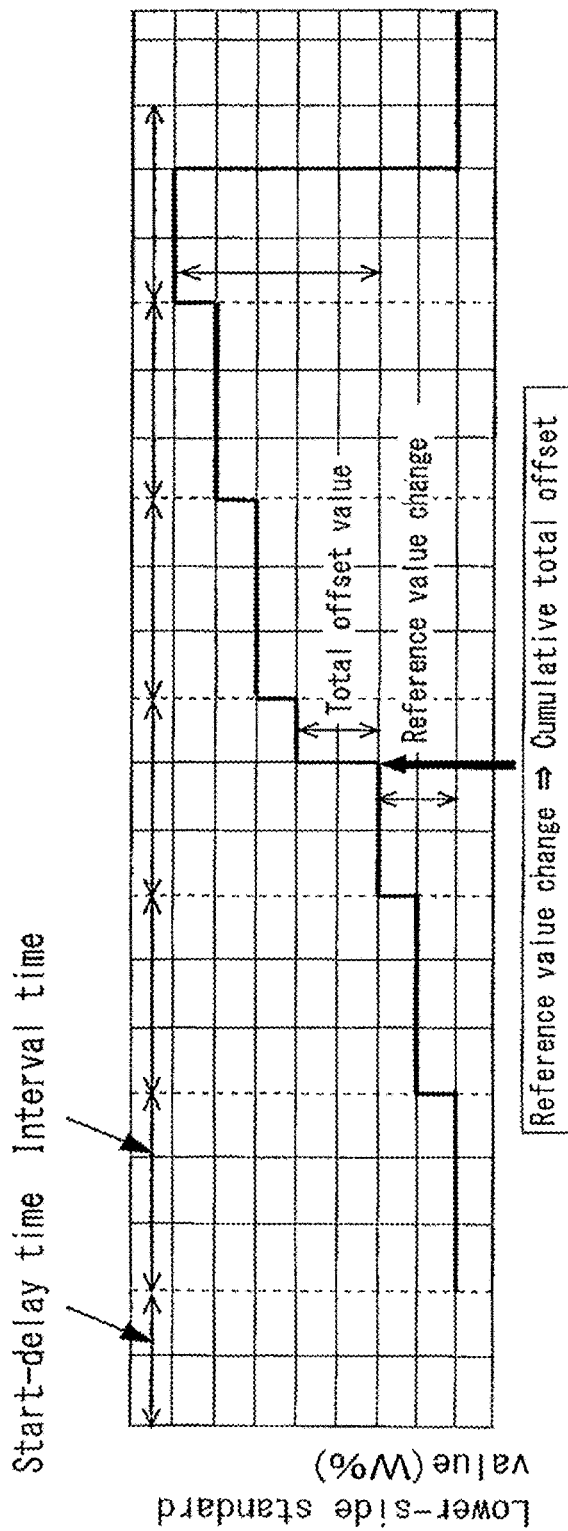
FIG. 10 shows a second example of a graph of the change mode of the lower-side standard value in the life time of the mixed-acid aqueous solution according to the second embodiment.

In the present embodiment, a change quantity of the increase width of the lower-side standard value of the concentration control may be fixed. Alternatively, as shown in FIG. 10, the lower-side standard value of the concentration control may be increased by using the total value of the past increase widths as the increase width, during the time between the intervals. In FIG. 10, after a lapse of the initial-variation start delay time of 60 minutes (3600 seconds), the interval time for changing the lower-side standard value of the concentration control is set at 90 minutes (5400 seconds). Basically, the increase width (offset) of D (W %) is set for each interval. At a timing between predetermined intervals, the lower-side standard value of the concentration control is increased by using a total value of the past increase widths as the increase width. This timing may be determined in advance by a program, or may be manually increased by the user.

Third Embodiment

Next, a third embodiment of the present invention will be described. In the third embodiment, a description will be given of an example in which the increase in the lower-side standard value of the concentration control of the mixed-acid aqueous solution is controlled by relating the increase in the lower-side standard value to the treatment quantity of the substrates W.

Figure 11:
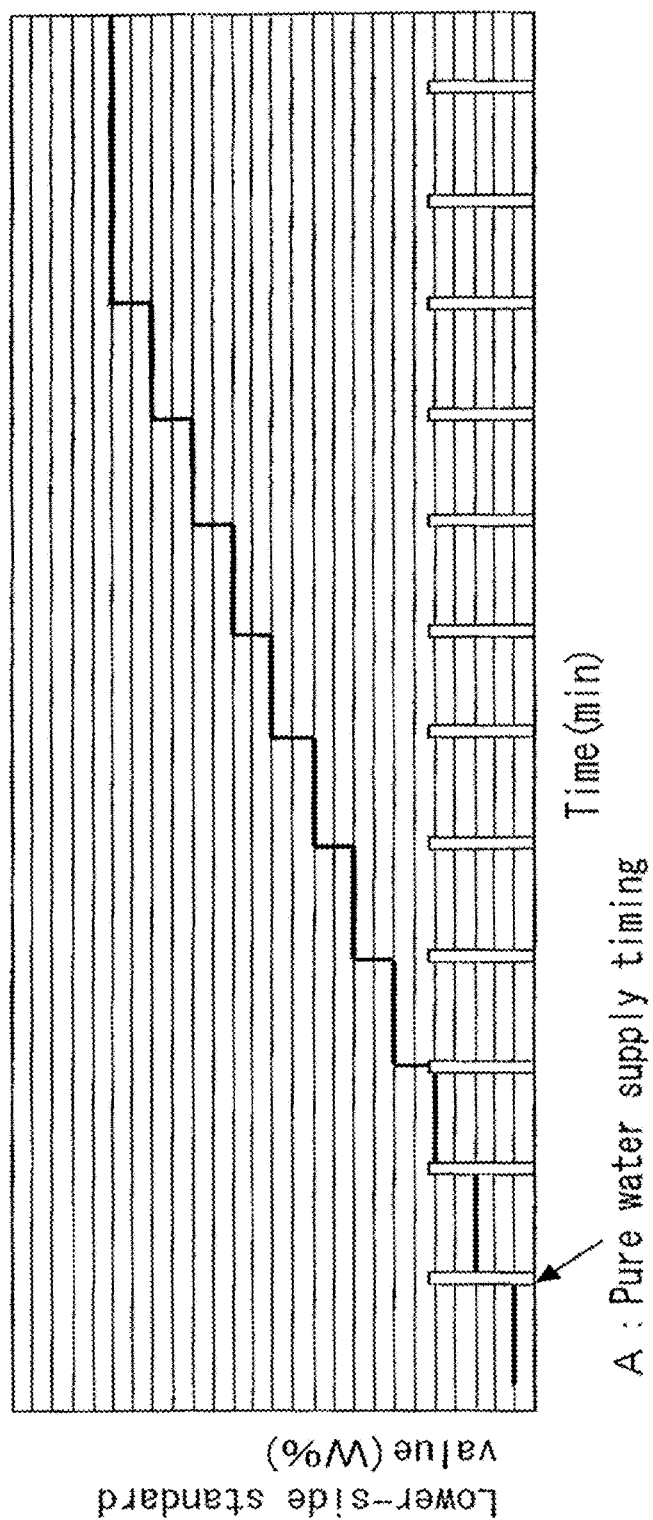
FIG. 11 shows an example of a graph of a change mode of a lower-side standard value in a life time of a mixed-acid aqueous solution according to a third embodiment.

In the present embodiment, as shown in FIG. 11, for example, the lower-side standard value of the concentration control of the mixed-acid aqueous solution may be increased at each replenishment timing of pure water. In FIG. 11, the vertical axis shows a lower-side standard value (W %) of the pure-water concentration control, and the horizontal axis shows time. Further, pulse-shaped display at a lower part of the graph shows a replenishment timing of pure water. In this case, immediately after the treatment of the substrates W is performed in the treating tank 7a, pure water is often replenished. A high correlation is observed between a timing when a treatment of the substrates W is performed in the treating tank 7a and a timing when pure water is replenished.

Therefore, as shown in FIG. 11, by increasing the lower-side standard value of the concentration control of the mixed-acid aqueous solution at each replenishment timing of pure water, it becomes possible to increase the lower-side standard value, in high correlation with the treatment of the substrates W in the treating tank 7a. According to the above configuration, the pure-water concentration of the mixed-acid aqueous solution can be more easily maintained in a proper value.

Figure 12:
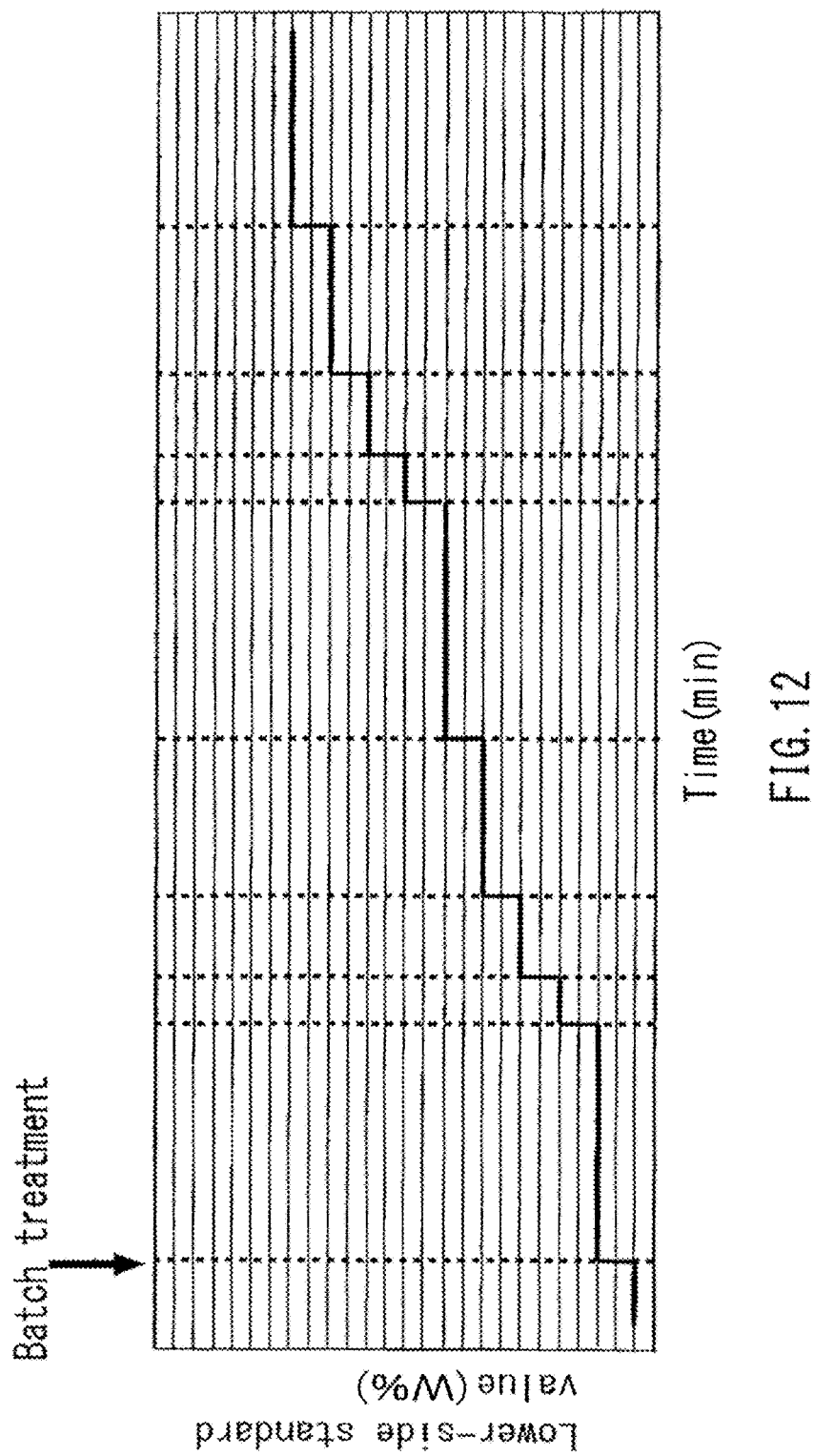
FIG. 12 shows a second example of a graph of the change mode of the lower-side standard value in the life time of the mixed-acid aqueous solution according to the third embodiment.

Further, in the present embodiment, as shown in FIG. 12, the lower-side standard value of the concentration control of the mixed-acid aqueous solution may be increased at each time of performing the treatment (a batch treatment) of the substrates W. In this case, after the treatment of the substrates W is performed in the treating tank 7a, the quantity of the metal ion accumulated in the mixed-acid aqueous solution tends to increase. Therefore, as shown in FIG. 12, by increasing the lower-side standard value of the concentration control at each time of performing the treatment (a batch treatment) of the substrates W, the lower-side standard value of the concentration control of the mixed-acid aqueous solution can be increased based on the timing of increasing the metal ion quantity accumulated in the mixed-acid aqueous solution. As a result, it is possible to perform the control of more facilitating the supply of pure water. As a result, the pure-water concentration of the mixed-acid aqueous solution can be more accurately maintained in a proper value.

In the present embodiment, at each time of performing the treatment (a batch treatment) of the substrates W, the interval of increasing the lower-side standard value of the concentration control of the mixed-acid aqueous solution may be shortened. Alternatively, at each time of performing the treatment (a batch treatment) of the substrates W, the increase width of increasing the lower-side standard value of the concentration control of the mixed-acid aqueous solution may be increased.

Figure 13:
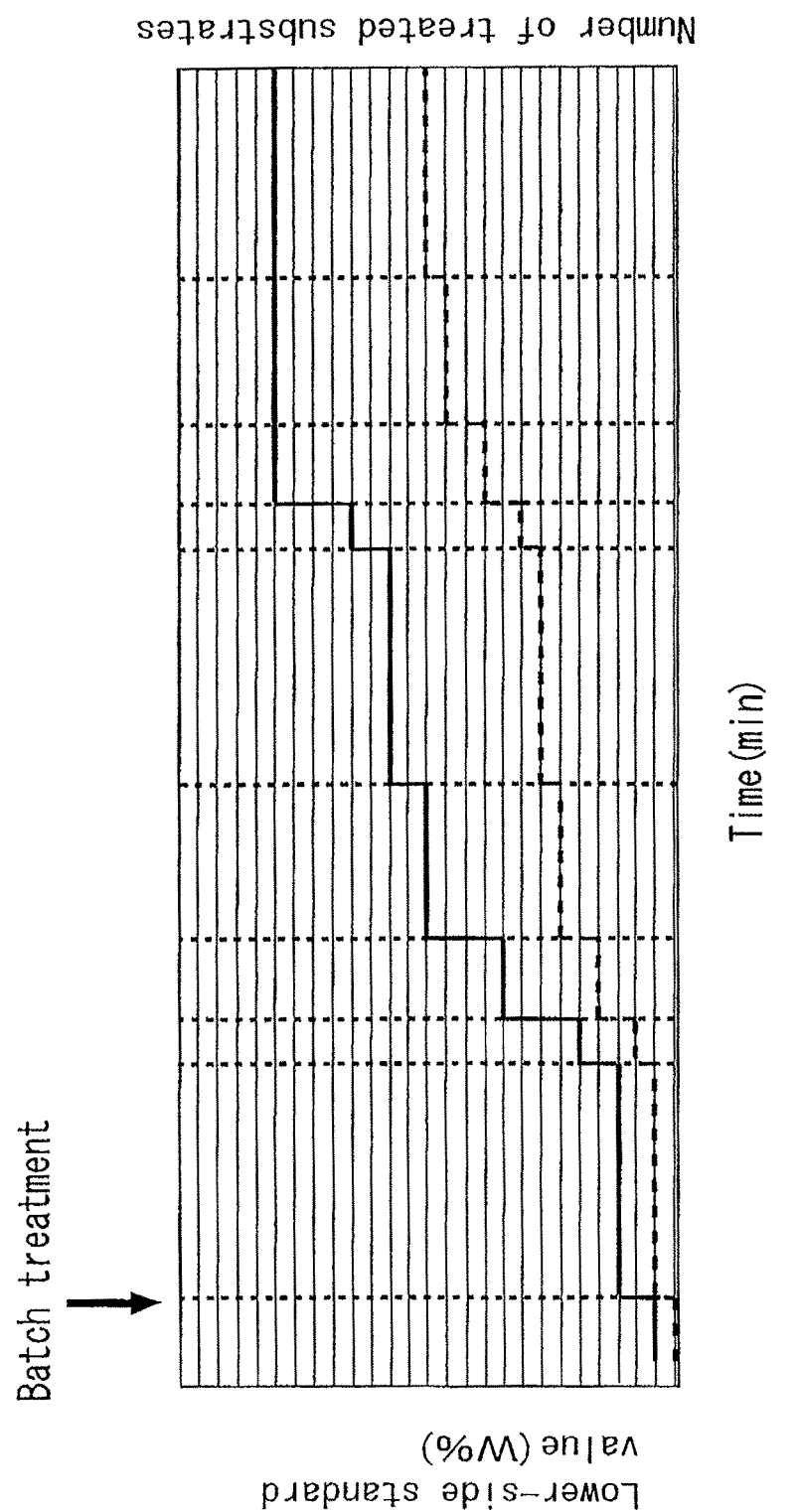
FIG. 13 shows a third example of a graph of the change mode of the lower-side standard value in the life time of the mixed-acid aqueous solution according to the third embodiment.

In addition, in the present embodiment, as shown in FIG. 13, for example, the lower-side standard value of the concentration control of the mixed-acid aqueous solution may be increased in accordance with the number of the substrates W treated in the treating tank 7a. In FIG. 13, the horizontal axis shows time, and the vertical axis shows a lower-side standard value and the number of the treated substrates W. In the drawing, the line indicated by a broken line shows the number of the treated substrates W, and the line indicated by a solid line in the drawing shows a lower-side standard value. In FIG. 13, the lower-side standard value of the concentration control of the mixed-acid aqueous solution is increased at each time of increasing the number of the substrates W treated in the treating tank 7a by a predetermined number (50, for example).

According to the above configuration, it can be directly coped with the increase in quantity of the metal ion accumulated in the mixed-acid aqueous solution by increasing the number of the treated substrates W by 50, for example. That is, the quantity of the metal ion accumulated in the mixed-acid aqueous solution is considered to have a high correlation with the number of the treated substrates W. Therefore, it can more accurately be coped with the divergence between the apparent pure-water concentration and the actual pure-water concentration due to the increase in the metal ion accumulated in the mixed-acid aqueous solution. Even when the number of semiconductor wafers treated is different at each treatment (a batch treatment) of the substrates W, a mixed-acid aqueous solution of a pure-water concentration optimum for the treatment at each time point can be obtained more accurately.

Fourth Embodiment

Next, a fourth embodiment of the present invention will be described. In the fourth embodiment, a description will be given of an example in which the increase in the lower-side standard value of the concentration control of the mixed-acid aqueous solution is controlled by relating the increase in the lower-side standard value to the treatment quantity of the substrates W. In this example, the lower-side standard value of the concentration control of the mixed-acid aqueous solution is increased in accordance with a cumulative value of the etching quantity in the treating tank.

It is known in advance that the etching quantity in one treatment is different depending on the kind of the substrate W and that even when the same number of the substrates W are treated, a change in the concentration of the mixed-acid aqueous solution is different depending on the kind of the substrate W. Therefore, in the present embodiment, the etching quantity of treating one substrate W is weighted by a weight coefficient in accordance with a kind of the substrate W. Then, a cumulative value of the etching quantity is calculated based on the weight coefficient and the number of the treated substrates for each kind of substrate W. At each time when the cumulative value of the etching quantity reaches a predetermined quantity, the lower-side standard value of the concentration control of the mixed-acid aqueous solution is increased.

Figure 14:
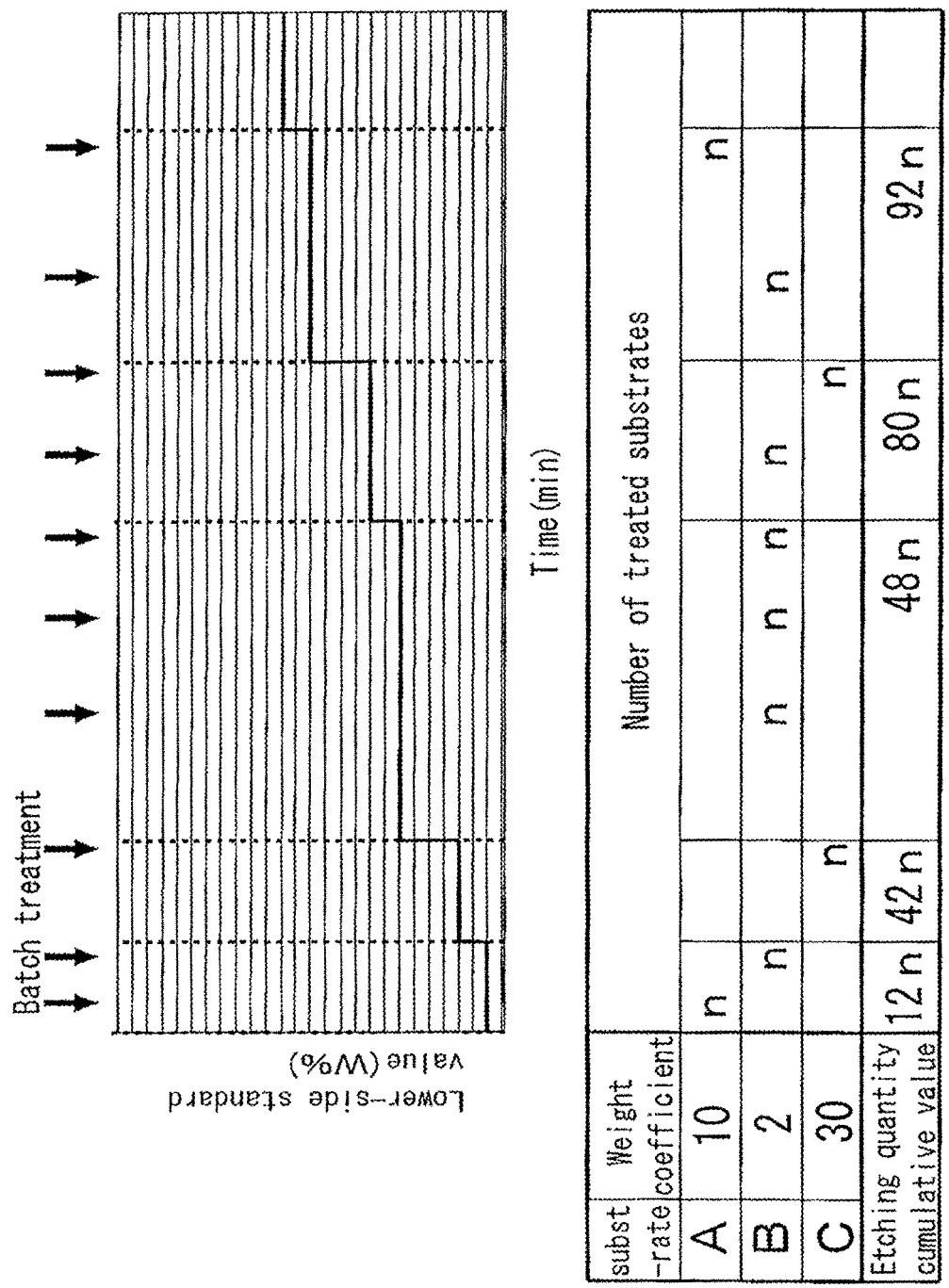
FIG. 14 shows an example of a graph of a change mode of a lower-side standard value in a life time of a mixed-acid aqueous solution according to a fourth embodiment.

FIG. 14 shows an example of a cumulative value of the etching quantity when three kinds of substrates W are treated in the present embodiment, and a change in the lower-side standard value of the concentration control of the mixed-acid aqueous solution according to the cumulative value of the etching quantity. As shown in FIG. 14, in the present embodiment, a batch treatment is performed on the three kinds of substrates W of A, B, and C. The weight coefficients of the etching quantity of the three kinds of substrates W of A, B, and C are 10, 2, and 30, respectively. In the present embodiment, the number of the treated substrates W multiplied by a weight coefficient is calculated for each kind of substrate W. The calculations for all the substrates are added so that a cumulative value of the etching quantity is calculated. When the number of the treated substrates W at one treatment for each kind of substrate W is n, the lower-side standard value of the concentration control of the mixed-acid aqueous solution is increased by one stage at each time when the cumulative value of the etching quantity reaches 12n.

In the example shown in FIG. 14, after the treatment is started, n substrates A are first batch treated. Because a weight coefficient of the substrate A is 10, a cumulative value of the etching quantity at this time point is 10n. Next, n substrates B are batch treated. Because a weight coefficient of the substrate B is 2, the etching quantity 2n is added, and at this time point, a cumulative value of the etching quantity reaches 12n. Therefore, at this time point, the lower-side standard value of the concentration control of the mixed-acid aqueous solution is increased by one stage.

Next, in the present embodiment, n substrates C are treated. Because a weight coefficient of the substrate C is 30, the etching quantity 30n is added, and at this time point, a cumulative value of the etching quantity reaches 42n, and exceeds three times of a threshold value 12n. Therefore, at this time point, the lower-side standard value of the concentration control of the mixed-acid aqueous solution is increased by two stages.

Thereafter, in the present embodiment, the treatment of n substrates B is repeated three times. Because a weight coefficient of the substrate B is 2, at each treatment, the etching quantity 2n is added, and a cumulative value of the etching quantity increases to 44n, 46n, and 48n. Then, at this time point, a cumulative value of the etching quantity increases to four times of the threshold value 12n. Therefore, at this time point, the lower-side standard value of the concentration control of the mixed-acid aqueous solution is further increased by one stage.

Thereafter, in the present embodiment, the treatment of n substrates B is performed, and a cumulative value of the etching quantity becomes 50n. Subsequently, the treatment of n substrates C is performed. Then, a cumulative value of the etching quantity becomes 80n, and at this time point, exceeds six times of the threshold value 12n. Therefore, at this time point, the lower-side standard value of the concentration control of the mixed-acid aqueous solution is further increased by two stages.

Further, in the present embodiment, the treatment of n substrates B is performed, and a cumulative value of the etching quantity becomes 82n. Subsequently, the treatment of n substrates A is performed. Then, a cumulative value of the etching quantity becomes 92n, and at this time point, exceeds seven times of the threshold value 12n. Therefore, at this time point, the lower-side standard value of the concentration control of the mixed-acid aqueous solution is further increased by one stage.

As described above, in the present embodiment, the etching quantity is weighted with a weight coefficient for each substrate to be treated. Based on both a weight coefficient and the number of the treated substrates for each kind of substrate, a cumulative value of the etching quantity of a plurality of kinds of substrates is calculated. Then, at each time when a cumulative value of the etching quantity reaches a predetermined quantity, the lower-side standard value of the concentration control of the mixed-acid aqueous solution is increased by a predetermined quantity. According to the above configuration, the concentration of the pure water or of the other predetermined components in the mixed-acid aqueous solution can be more accurately maintained in a proper value. In the present embodiment, the treatment of a plurality of kinds of substrates during a life time of the treating liquid is described. Alternatively, in the case of treating only one kind of substrate during a life time of the treating liquid, a cumulative value of the etching quantity of the substrates W may be calculated. At each time when a cumulative value of the etching quantity reaches a predetermined quantity, the lower-side standard value of the concentration control of the mixed-acid aqueous solution may be increased by a predetermined quantity.

Fifth Embodiment

Next, a fifth embodiment of the present invention will be described. In the fifth embodiment, a description will be given of an example in which the lower-side standard value of the concentration control of the mixed-acid aqueous solution is increased in accordance with a cumulative value of the etching quantity in the treating tank, in a similar manner to that in the fourth embodiment. Also, in this example, when a treatment of the substrates is not performed even when a predetermined waiting time elapses, the lower-side standard value of the concentration control of the mixed-acid aqueous solution is increased.

In this case, it is known in advance that even when a treatment of the substrates W is not performed at all, after a lapse of a certain degree of time, the concentration of the mixed-acid aqueous solution changes due to evaporation and decomposition. Therefore, in the present embodiment, at each time when a cumulative value of the etching quantity, which is based on both a weight coefficient and the number of the treated substrates for each kind of substrate to be treated, reaches a predetermined quantity, the lower-side standard value of the concentration control of the mixed-acid aqueous solution is increased by the predetermined quantity. Also, when none of the substrates W are treated after a predetermined waiting time has elapsed, the lower-side standard value of the concentration control of the mixed-acid aqueous solution is increased.

Figure 15:
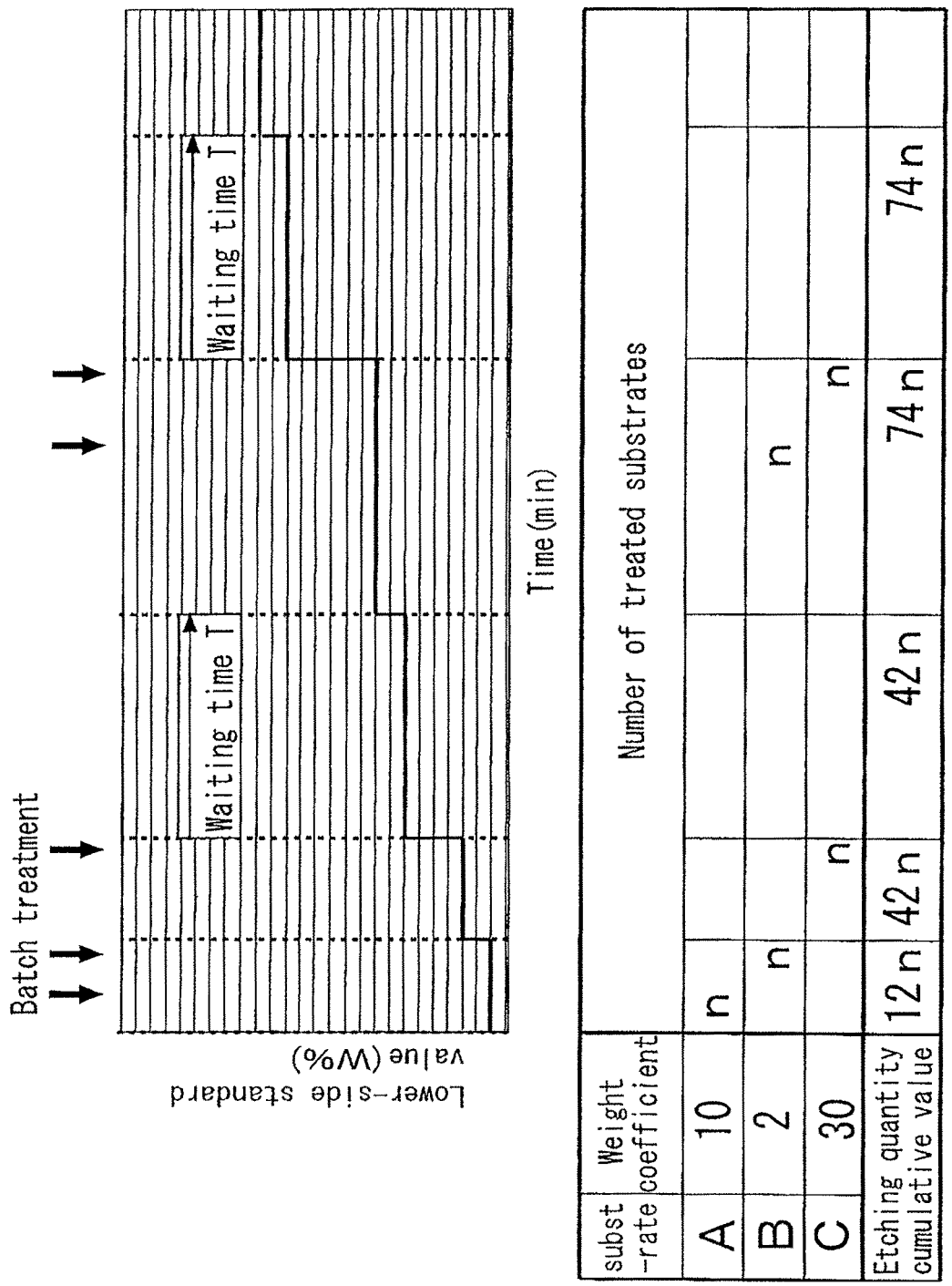
FIG. 15 shows an example of a graph of a change mode of a lower-side standard value in a life time of a mixed-acid aqueous solution according to a fifth embodiment.

FIG. 15 shows an example of the number of three kinds of treated substrates W, and a change in the lower-side standard value of the concentration control of the mixed-acid aqueous solution according to the number in the present embodiment. As shown in FIG. 15, also in the present embodiment, a batch treatment is performed on three kinds of the substrates W of A, B, and C. The weight coefficients of the etching quantity of the substrates W of A, B, and C are 10, 2, and 30, respectively.

Also in the present embodiment, the number of the treated substrates W multiplied by a weight coefficient is calculated for each kind of substrate W. The calculations for all the substrates are added so that a cumulative value of the etching quantity is calculated. When the number of the substrates W treated at one treatment for each kind of substrate W is n, the lower-side standard value of the concentration control of the mixed-acid aqueous solution is increased by one stage at each time when the cumulative value of the etching quantity reaches 12n. The lower-side standard value of the concentration control of the mixed-acid aqueous solution is also increased when none one of the substrates W is treated during a predetermined waiting time T.

In the example shown in FIG. 15, after the treatment is started, n substrates A are first batch treated. Because a weight coefficient of the substrate A is 10, a cumulative value of the etching quantity at this time point is 10n. Next, n substrates B are batch treated. Because a weight coefficient of the substrate B is 2, the etching quantity 2n is added, and at this time point, a cumulative value of the etching quantity reaches 12n. Therefore, at this time point, the lower-side standard value of the concentration control of the mixed-acid aqueous solution is increased by one stage.

Next, in the present embodiment, n substrates C are treated. Because a weight coefficient of the substrate C is 30, the etching quantity 30n is added, and at this time point, a cumulative value of the etching quantity reaches 42n, and exceeds three times of a threshold value 12n. Therefore, at this time point, the lower-side standard value of the concentration control of the mixed-acid aqueous solution is increased by two stages.

Thereafter, in the present embodiment, none of the substrates is treated during the waiting time T. Therefore, after a cumulative value of the etching quantity reaches 42n, at a time point when the waiting time T elapses, the lower-side standard value of the concentration control of the mixed-acid aqueous solution is increased by one stage.

Further, in the present embodiment, the treatment of n substrates B is performed, and a cumulative value of the etching quantity becomes 44n. Subsequently, the treatment of n substrates C is performed. Then, a cumulative value of the etching quantity becomes 74n, and at this time point, exceeds six times of the threshold value 12n. Therefore, at this time point, the lower-side standard value of the concentration control of the mixed-acid aqueous solution is further increased by three stages.

Thereafter, in the present embodiment, none of the substrates is treated during the waiting time T. Therefore, after a cumulative value of the etching quantity reaches 74n, at a time point when the waiting time T elapses, the lower-side standard value of the concentration control of the mixed-acid aqueous solution is increased by one stage.

As described above, in the present embodiment, based on both a weight coefficient and the number of the treated substrates for each kind of substrate, a cumulative value of the etching quantity of the plurality of kinds of substrates is calculated. At each time when the cumulative value of the etching quantity reaches a predetermined quantity, the lower-side standard value of the concentration control of the mixed-acid aqueous solution is increased by a predetermined quantity. Then, also when none of the substrates is treated during the waiting time T, the lower-side standard value of the concentration control of the mixed-acid aqueous solution is increased by a predetermined quantity. According to the above configuration, the concentration of the pure water or of the other predetermined components in the mixed-acid aqueous solution can be more accurately maintained in a proper value. The control described in the present embodiment can be also applied to the treatment of only one kind of substrate during a life time of the treating liquid.

In the above embodiment, the description has been given of the example of controlling a pure-water concentration by supplying pure water out of constituent components of the mixed-acid aqueous solution. Alternatively, a concentration control of a mixed acid may be performed by supplying at least any one of the other predetermined components of the mixed-acid aqueous solution, that is, phosphoric acid, nitric acid, and acetic acid. Further, in the above embodiment, it has been described that the treating liquid is a mixed-acid aqueous solution. The present invention can be also applied to another treating liquid such as phosphoric acid.

Further, in the above embodiment, it has been described that the concentration meter 24 is an in-line system. Alternatively, a sampling system may be employed. Further, for the concentration control of the mixed-acid aqueous solution, instead of the concentration of the component of pure water for example, other parameters having a high correlation with the concentration such as ph and electric conductivity may be detected, and the detected parameters may be converted to a concentration. Further, in the above embodiment, pure water is replenished in the inner tank 50a of the treating tank 7a. Alternatively, pure water may be replenished in the outer tank 50b. Further, in the above embodiment, a replenishment quantity of pure water or the like is controlled by opening and closing the pure-water replenishment valve 49. Alternatively, a suitable quantity of pure water may be replenished by controlling the pump.

In addition, in the above embodiment, the target-value change unit automatically changes the lower-side standard value. Alternatively, the target-value change unit may make the operator (an actual person or a person who operates the operation terminal on the online) check whether to change a target value. Specifically, that the target value should be changed may be displayed on the front panel. When the operator has permitted, the target value may be changed. When the operator has not permitted, the target value may be maintained.

What is claimed is:

1. A substrate treating method for performing a predetermined treatment on substrates by immersing the substrates into a treating liquid that includes two or more kinds of chemical liquids containing at least phosphoric acid and pure water and is stored in a treating tank, the substrate treating method comprising:
   the substrates treating step of performing a predetermined treatment on a substrate by immersing the substrates into the treating liquid stored in the treating tank;
   a treating-liquid exchange step of exchanging the total treating liquid in the treating tank based on a life time of the treating liquid;
   a concentration detecting step of detecting a concentration of the pure water in the treating liquid supplied to the treating tank;
   a concentration control step of supplying pure water to the treating liquid in the treating tank such that the concentration becomes a predetermined target concentration of pure water, based on the concentration detected in the concentration detecting step; and
   a target-value change step of increasing the target concentration of pure water by changing a target value of a concentration based on a feedback control of the concentration of pure water, in a middle of a life time of the treating liquid, which is a period after a total liquid exchange is performed and before a total liquid exchange is performed again, and in a period when the predetermined treatment is performed.

2. The substrate treating method according to claim 1, wherein the target-value change step includes only increasing the target concentration of pure water multiple times.

3. The substrate treating method according to claim 1, wherein the target-value change step includes providing an upper limit value in the target concentration of pure water.

4. The substrate treating method according to claim 1, wherein
   the treating liquid is a mixed-acid aqueous solution containing the pure water, the phosphoric acid, nitric acid, and acetic acid, and
   the concentration control step includes supplying pure water to the mixed-acid aqueous solution such that a pure-water concentration of the mixed-acid aqueous solution becomes a predetermined target concentration.

5. The substrate treating method according to claim 1, wherein the target-value change step includes only increasing the target concentration of pure water multiple times at an equal interval.

6. The substrate treating method according to claim 1, wherein the target-value change step includes changing a timing of increasing the target concentration of pure water.

7. The substrate treating method according to claim 1, wherein the target-value change step includes increasing the target concentration of pure water at equal intervals.

8. The substrate treating method according to claim 1, wherein the target-value change step includes increasing the target concentration of pure water when a supply of the pure water is performed.

9. The substrate treating method according to claim 1, wherein the target-value change step includes increasing the target concentration of pure water when a treatment of a predetermined number of the substrates is performed.

10. The substrate treating method according to claim 1, wherein the predetermined treatment on the substrates includes an etching treatment, further comprising a step of defining a weight coefficient corresponding to an etching quantity, which is a quantity of substrate material to be etched in one treatment of the substrate,
   wherein in the case that a treatment of a predetermined number of the substrates is performed in the substrate treating step, the target-value change step includes increasing the target concentration of pure water when the number of the treated substrates multiplied by the weight coefficient has become a predetermined quantity.

11. The substrate treating method according to claim 1, wherein the target concentration of pure water is a lower-side standard value as a threshold for supplying pure water when the concentration of the pure water is reduced and reaches the lower-side standard value, and
   a divergence between an actual pure-water concentration and an apparent pure-water concentration is canceled by increasing the lower-side standard value.

12. The substrate treating method according to claim 10, further comprising a step of defining the weight coefficient in accordance with a kind of substrate,
   wherein in the case that a treatment of a predetermined number of kinds of the substrates is performed in the substrate treating step, the target-value change step includes increasing the target concentration of pure water when a total number of the treated substrates multiplied by the weight coefficient for each kind of substrate out of the plurality of kinds of substrates, has become a predetermined quantity.

13. The substrate treating method according to claim 10, wherein the substrate treating step is performed multiple times, further comprising a waiting step in which no substrate is immersed into the treating liquid stored in the treating tank and no predetermined treatment is performed, in the period between substrate treating steps, and
   the target-value change step includes increasing the target concentration of pure water when the period of time of the waiting step reaches a predetermined waiting time during the life time of the treating liquid.

* * * * *